United States Patent
Burd

(10) Patent No.: US 6,504,493 B1
(45) Date of Patent: Jan. 7, 2003

(54) METHOD AND APPARATUS FOR ENCODING/DECODING DATA

(75) Inventor: Gregory Burd, San Jose, CA (US)

(73) Assignee: Marvell International, Ltd., Hamilton (BM)

( * ) Notice: Subject to any disclaimer, the term of this patent is extended or adjusted under 35 U.S.C. 154(b) by 0 days.

(21) Appl. No.: 09/699,513

(22) Filed: Oct. 31, 2000

(51) Int. Cl.⁷ .................................................. H03M 7/00
(52) U.S. Cl. ........................ 341/50; 341/58; 341/59; 341/65; 341/67; 714/801; 714/758; 714/768
(58) Field of Search ............................ 341/58, 59, 65, 341/67; 714/758, 768, 801

(56) References Cited

U.S. PATENT DOCUMENTS

| | | | |
|---|---|---|---|
| 4,413,251 A | 11/1983 | Adler et al. ................. 340/347 |
| 4,684,921 A | 8/1987 | Fok et al. ..................... 340/347 |
| 4,688,016 A | 8/1987 | Fok ............................. 340/347 |
| 4,888,779 A | 12/1989 | Karabed et al. ............... 371/43 |
| 4,949,196 A * | 8/1990 | Davie et al. .................... 360/40 |
| 5,177,482 A | 1/1993 | Cideciyan et al. ............ 341/59 |
| 5,198,813 A | 3/1993 | Isozaki .......................... 341/59 |
| 5,491,479 A | 2/1996 | Wilkinson .................... 341/58 |
| 5,537,424 A | 7/1996 | Karabed et al. ............... 371/43 |
| 5,604,497 A * | 2/1997 | Sonntag ......................... 341/59 |
| 5,608,397 A | 3/1997 | Soljanin ........................ 341/58 |
| 5,708,536 A | 1/1998 | Huang .......................... 360/40 |
| 5,742,243 A | 4/1998 | Moriyama .................... 341/59 |
| 5,757,294 A * | 5/1998 | Fisher et al. .................. 341/57 |
| 5,767,800 A * | 6/1998 | Machida et al. .............. 341/67 |
| 5,793,984 A * | 8/1998 | Helman ................... 395/200.77 |
| 5,910,969 A | 6/1999 | Sayiner et al. .............. 375/341 |
| 5,933,103 A | 8/1999 | Kim ............................. 341/59 |
| 6,229,458 B1 * | 5/2001 | Altekar et al. ................ 341/59 |
| 6,285,302 B1 * | 9/2001 | McClellan .................... 341/59 |

FOREIGN PATENT DOCUMENTS

| EP | 1058432 A2 | 6/2000 | ........... H04L/25/49 |

* cited by examiner

Primary Examiner—Michael Tokar
Assistant Examiner—Khai Nguyen
(74) Attorney, Agent, or Firm—Eric B. Janofsky

(57) ABSTRACT

A method and apparatus to encode data is provided. The method includes the steps of: i) dividing the data into a plurality of blocks, with each block having a plurality of bits, wherein the plurality of blocks includes a first subset of blocks and a second subset of blocks; ii) encoding data in the first subset; arranging a codeword to include the encoded data of the first subset and the second subset; iii) scanning a plurality of segments in the codeword for at least one predetermined sequence; and iv) encoding a scanned segment when the predetermined sequence is found in the segment. A method and apparatus to decode data is also provided according to the present invention.

233 Claims, 12 Drawing Sheets

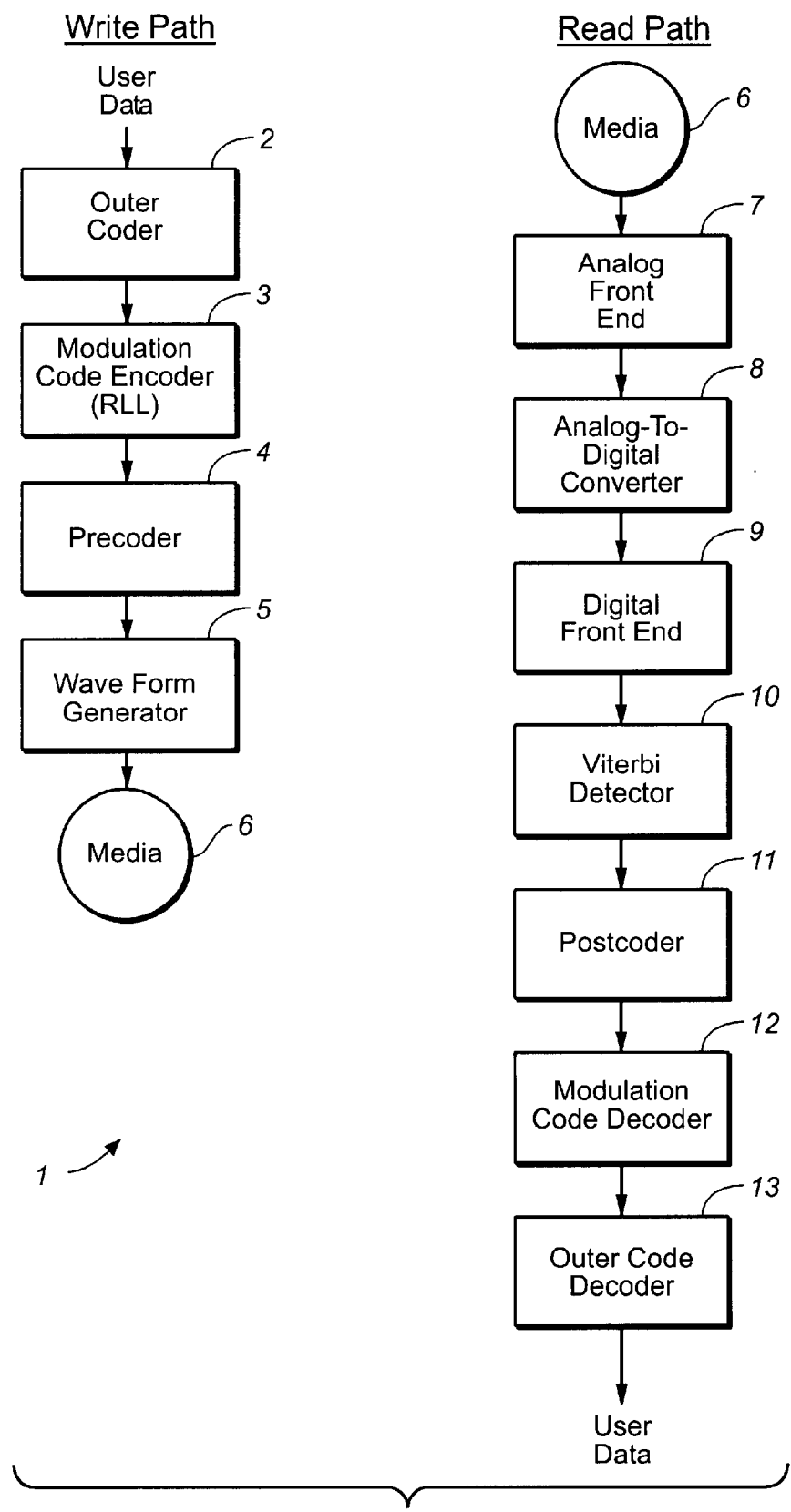
FIG._1

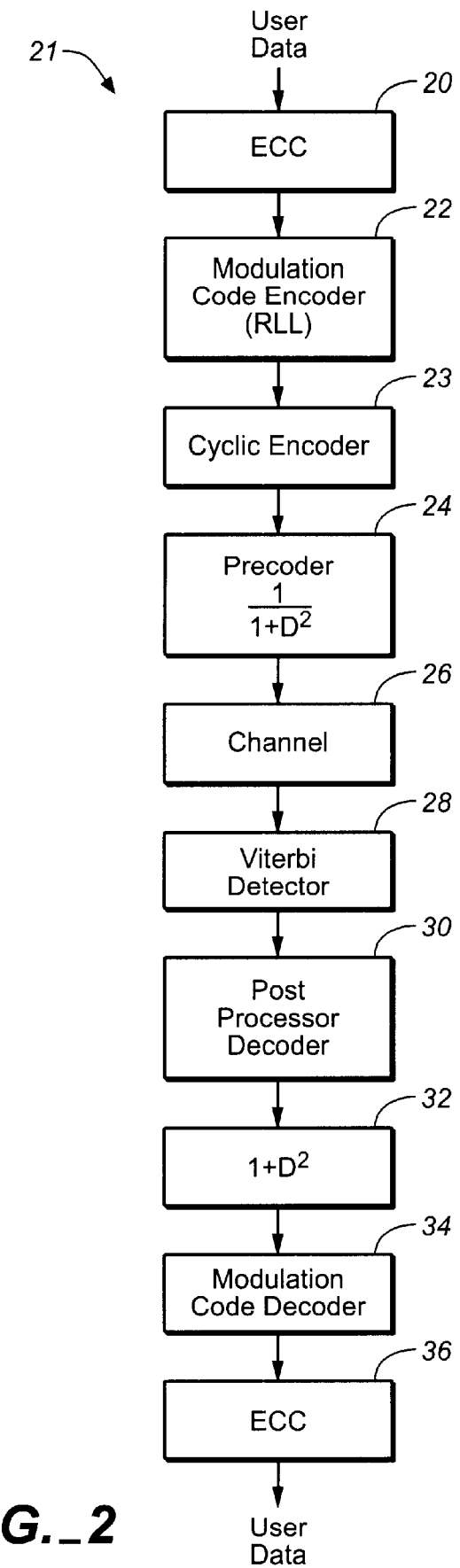
FIG._2

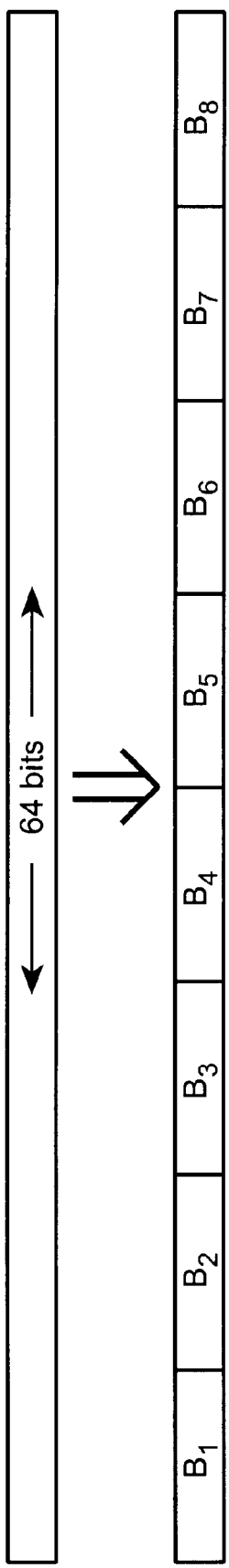
FIG._3
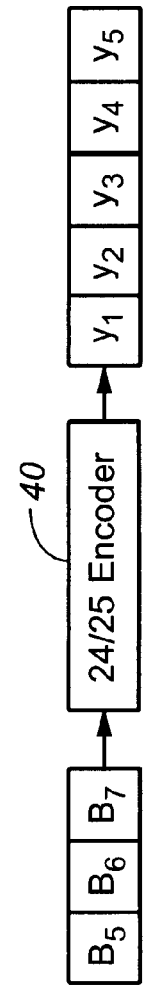
FIG._4

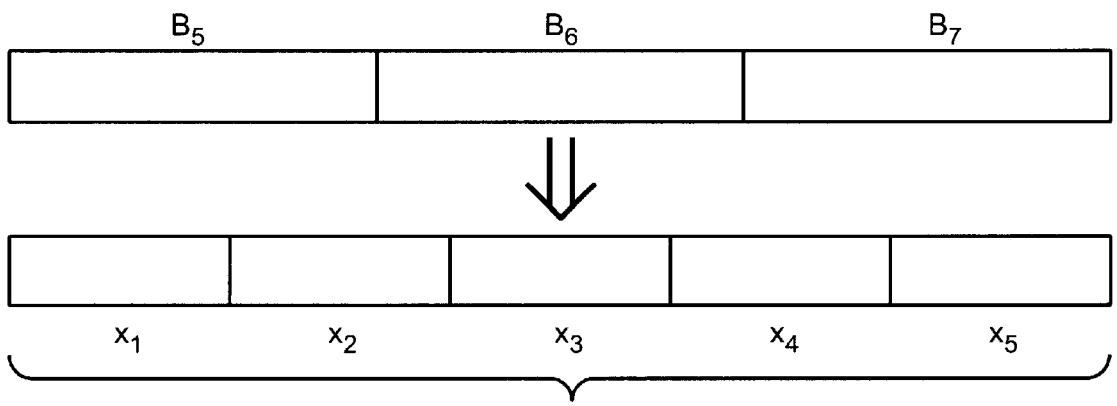
FIG._5a
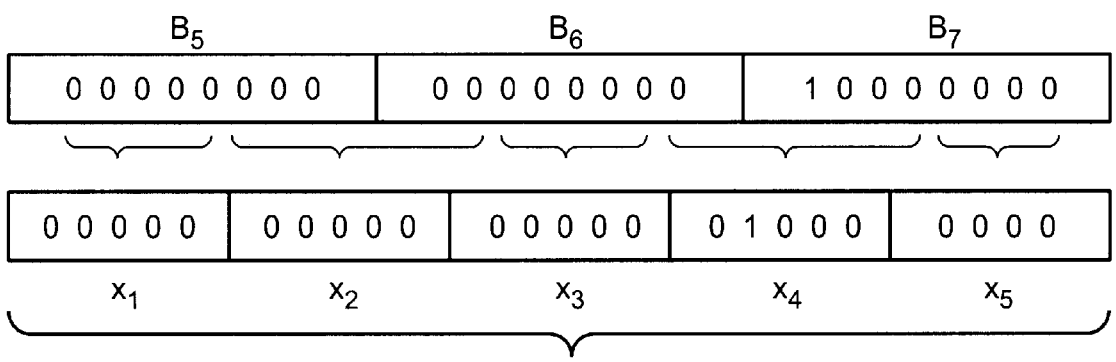
FIG._5b
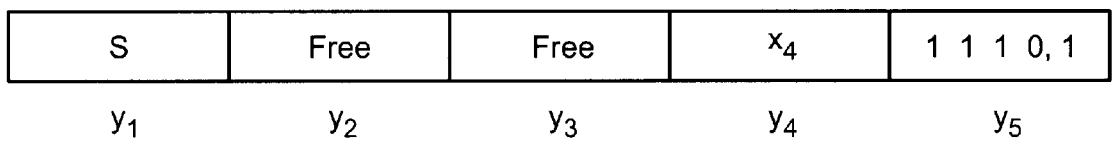
FIG._7a
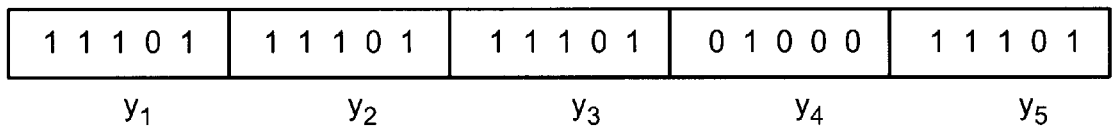
FIG._7b

24/25 Encoding/Decoding Table. Here free = (11101)

| $S_1S_2S_3S_4S_5$ | $y_1$ | $y_2$ | $y_3$ | $y_4$ | $y_5$ |
|---|---|---|---|---|---|
| 00000 | $x_1$ | $x_2$ | $x_3$ | $x_4$ | $x_5,0$ |
| 10000 | x | $x_2$ | $x_3$ | $x_4$ | $x_5,1$ |
| 01000 | s | $x_1$ | $x_3$ | $x_4$ | $x_5,1$ |
| 11000 | s | free | $x_3$ | $x_4$ | $x_5,1$ |
| 00100 | s | $x_1$ | $x_2$ | $x_4$ | $x_5,1$ |
| 10100 | s | $x_2$ | free | $x_4$ | $x_5,1$ |
| 01100 | s | $x_1$ | free | $x_4$ | $x_5,1$ |
| 11100 | s | free | free | $x_4$ | $x_5,1$ |
| 00010 | s | $x_1$ | $x_2$ | $x_3$ | $x_5,1$ |
| 10010 | s | $x_2$ | $x_3$ | free | $x_5,1$ |
| 01010 | s | $x_1$ | $x_3$ | free | $x_5,1$ |
| 11010 | s | free | $x_3$ | free | $x_5,1$ |
| 00110 | s | $x_1$ | $x_2$ | free | $x_5,1$ |
| 10110 | s | $x_2$ | free | free | $x_5,1$ |
| 01110 | s | $x_1$ | free | free | $x_5,1$ |
| 11110 | s | free | free | free | $x_5,1$ |
| 00001 | $x_1$ | $x_2$ | $x_3$ | $x_4$ | 0000,1 |
| 10001 | s | $x_2$ | $x_3$ | $x_4$ | 1110,1 |
| 01001 | s | $x_1$ | $x_3$ | $x_4$ | 1110,1 |
| 11001 | s | free | $x_3$ | $x_4$ | 1110,1 |
| 00101 | s | $x_1$ | $x_2$ | $x_4$ | 1110,1 |
| 10101 | s | $x_2$ | free | $x_4$ | 1110,1 |
| 01101 | s | $x_1$ | free | $x_4$ | 1110,1 |
| 11101 | s | free | free | $x_4$ | 1110,1 |
| 00011 | s | $x_1$ | $x_2$ | $x_3$ | 1110,1 |
| 10011 | s | $x_2$ | $x_3$ | free | 1110,1 |
| 01011 | s | $x_1$ | $x_3$ | free | 1110,1 |
| 11011 | s | free | $x_3$ | free | 1110,1 |
| 00111 | s | $x_1$ | $x_2$ | free | 1110,1 |
| 10111 | s | $x_2$ | free | free | 1110,1 |
| 01111 | s | $x_1$ | free | free | 1110,1 |
| 11111 | s | free | free | free | 1110,1 |

FIG._6

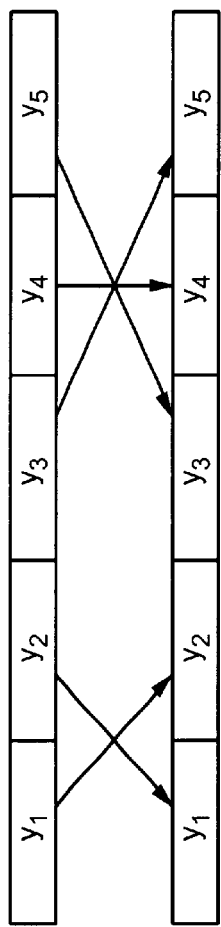
FIG._8
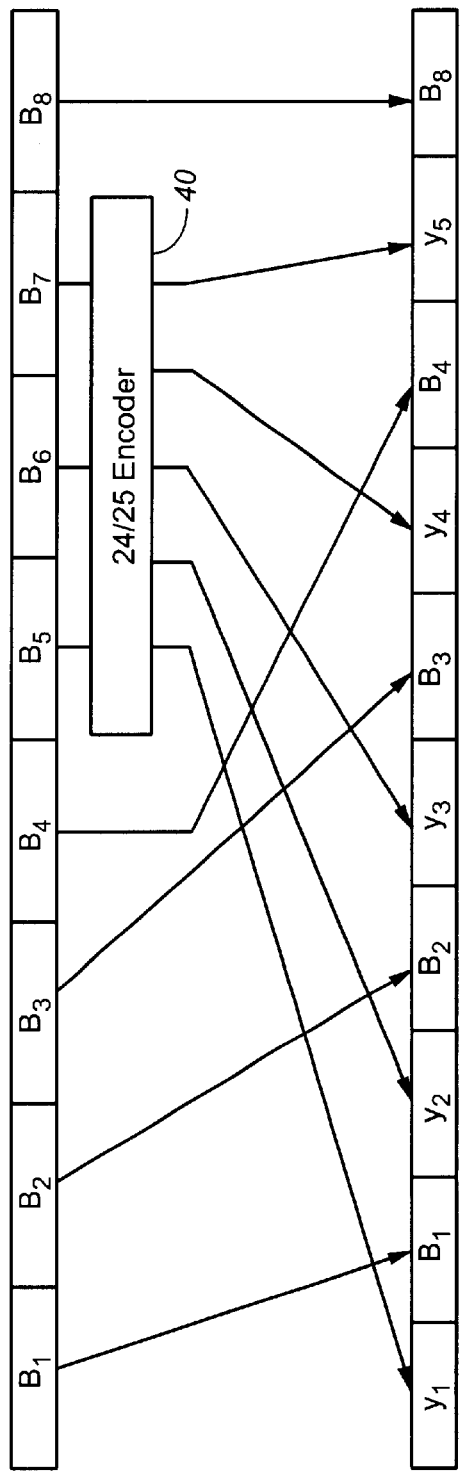
FIG._9
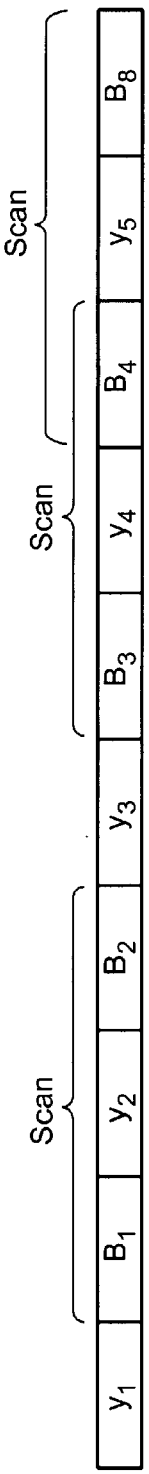
FIG._11

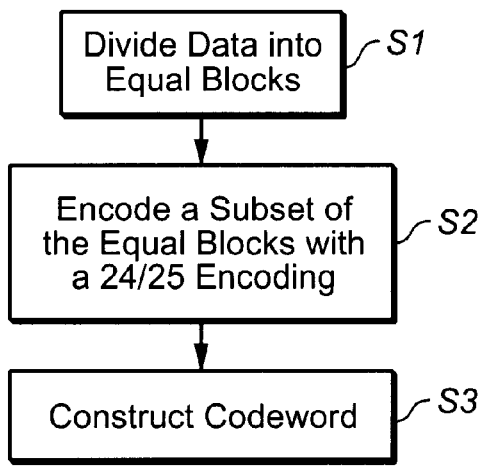
FIG._10a
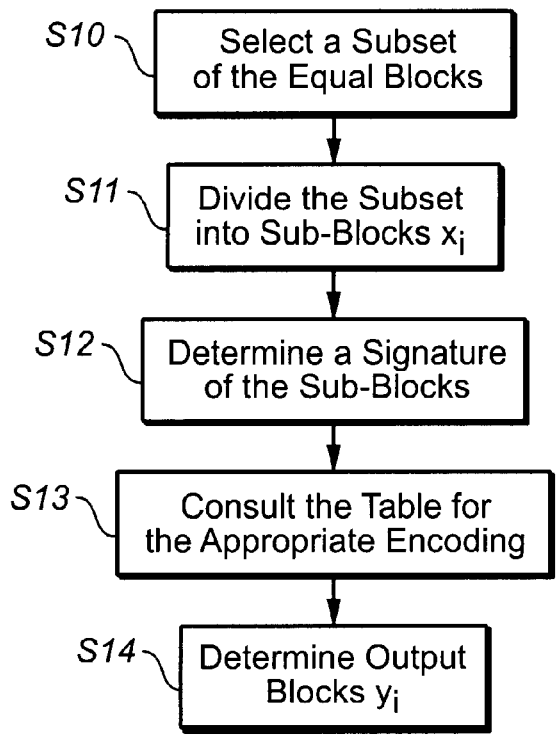
FIG._10b
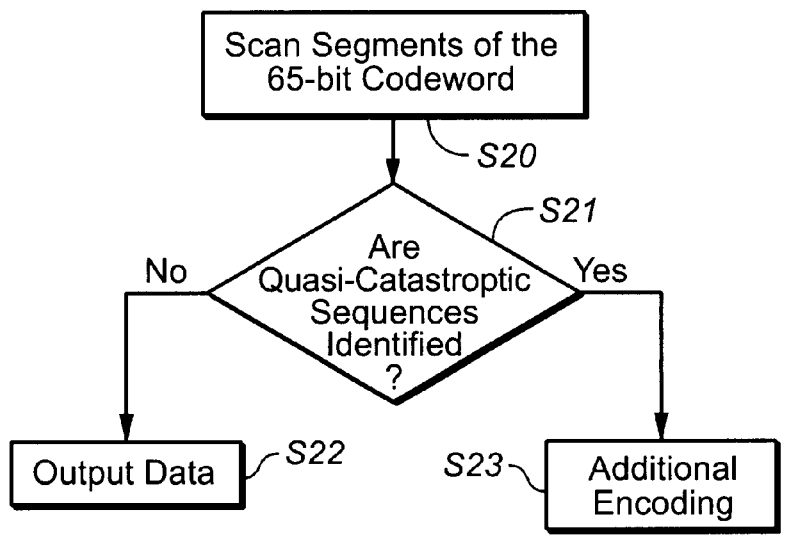
FIG._10c

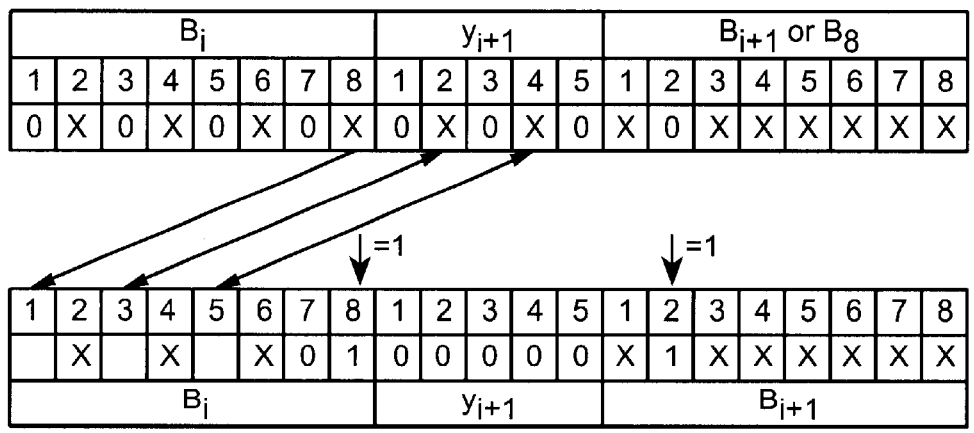
FIG._12
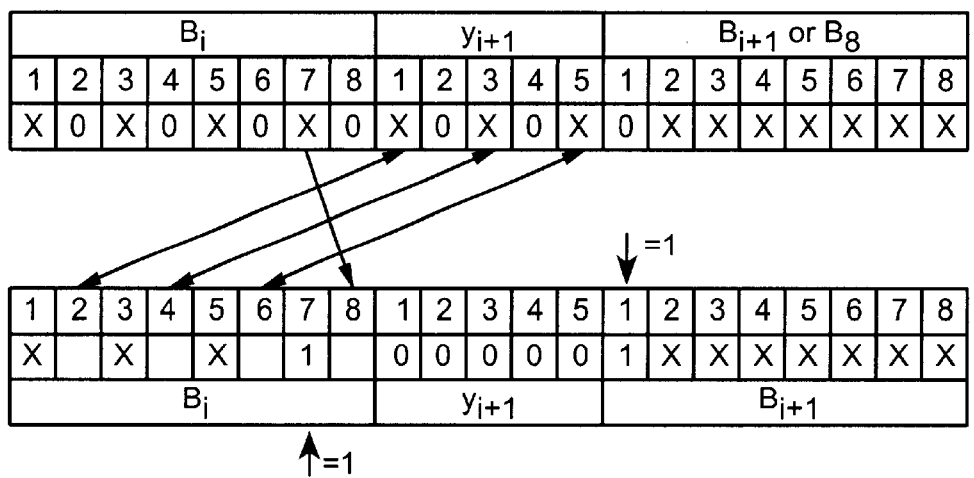
FIG._13
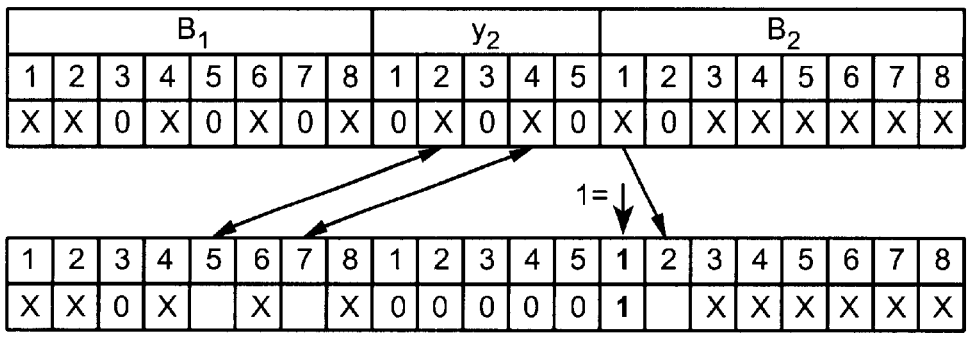
FIG._14

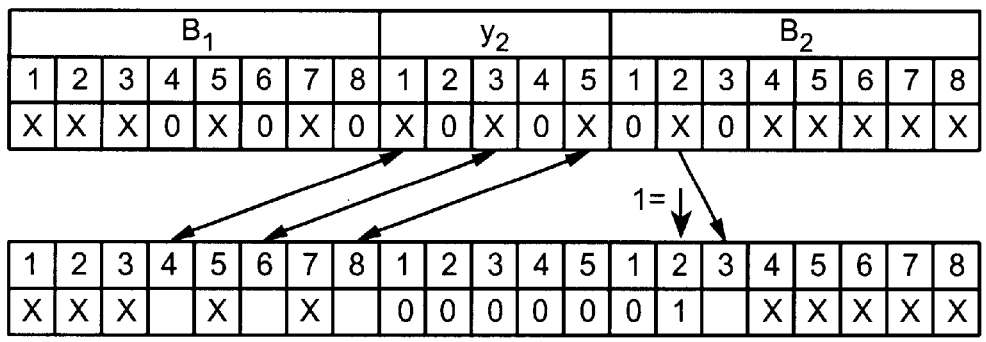
FIG._15
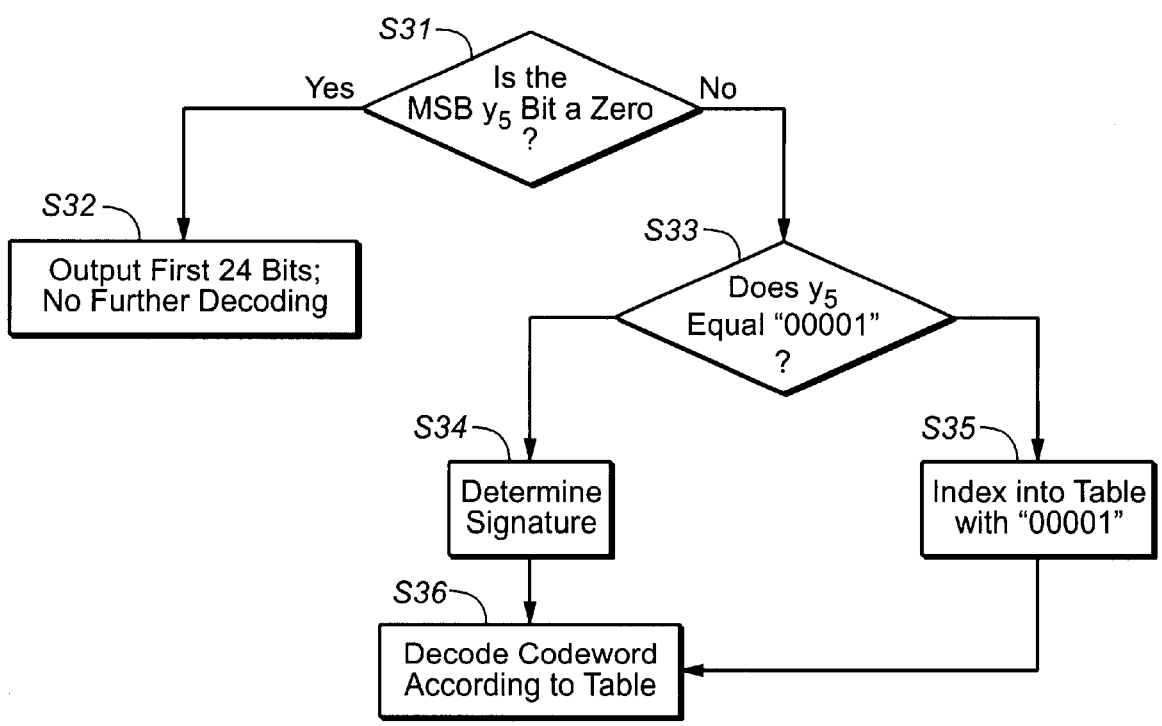
FIG._16

FIG.\_17a
FIG.\_17b
FIG.\_17c

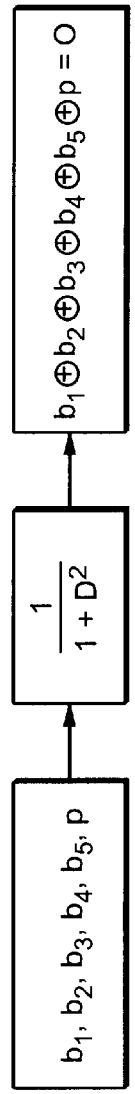
FIG._18
FIG._19

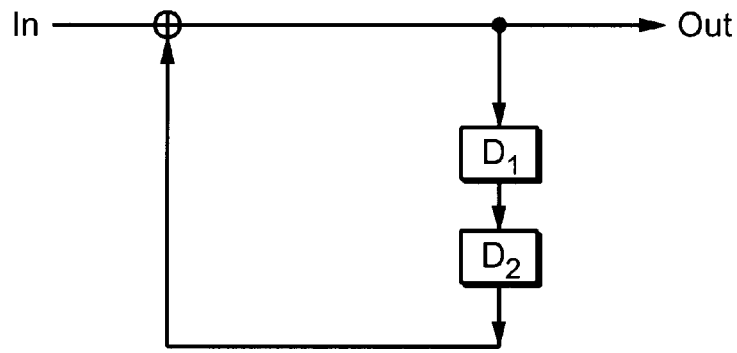
FIG._20
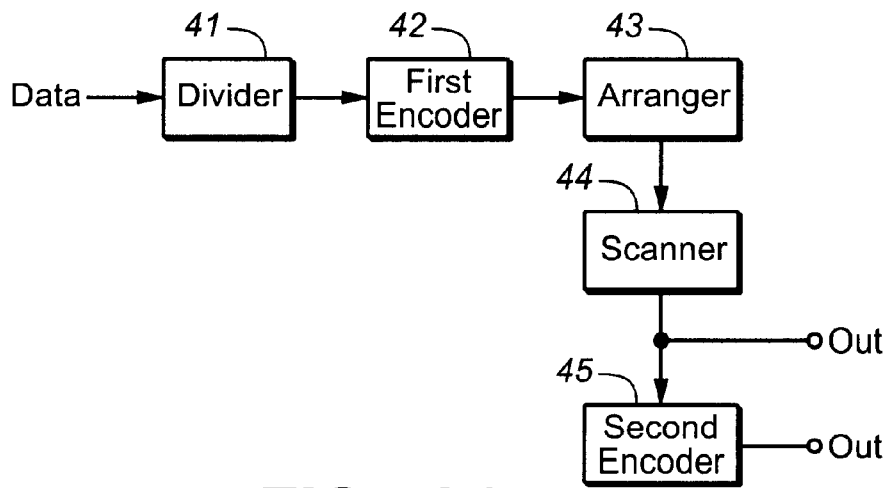
FIG._21a
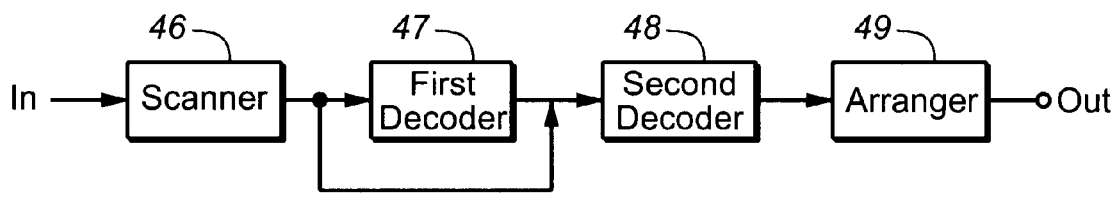
FIG._21b

METHOD AND APPARATUS FOR ENCODING/DECODING DATA

BACKGROUND OF THE INVENTION

1. Field of the Invention

The present invention relates generally to encoding and decoding data. More particularly, the present invention relates to run length limited (RLL) coding for recording data. The present invention further relates to encoding methods that achieve, for example, a 64/65 modulation code and a 64/66 modulation code.

2. Background and Related Art

Digital data is often converted from one format to another as it flows between computing devices, such as between a computer and a storage device. Such storage devices typically record data to a magnetic or optical medium. Data communicated to a storage device is often encoded into a RLL modulation code. Generally, RLL code limits continuos-repetition of a specific bit pattern, such as successive zeros (0s) and/or ones (1s).

RLL coding is often used when storing data since it provides particularly dense packing of data on a storage medium. Further reference may be had to U.S. Pat. Nos. 4,413,251, 4,684,921, 4,688,016, 4,949,196, 5,177,482, 5,198,813, 5,491,479, 5,708,536, 5,742,243, and 5,933,103, each herein incorporated by reference, for the general state of the RLL encoding art.

In recent years, there has been a push in the magnetic storage industry for higher rate RLL codes (e.g., 32/33 and 64/65 vs. rates of 8/9 and 16/17 as used in previous years). High rate RLL codes improve system performance by decreasing the overall channel bit density. However, there are tradeoffs for this advantage. For example, high rate RLL codes typically have higher error propagation, and are more complex from an implementation point of view.

Accordingly, there remains a need for an apparatus and method that provide efficient modulated codes for higher rate RLL codes.

SUMMARY OF THE INVENTION

The present invention provides a method and apparatus for encoding/decoding data.

A method of encoding data is provided according to a first aspect of the present invention. The method includes the steps of: i) dividing the data into a plurality of blocks, with each block having a plurality of bits, wherein the plurality of blocks includes a first subset of blocks and a second subset of blocks; ii) encoding data in the first subset; iii) arranging a codeword to include the encoded data of the first subset and the second subset; iv) scanning a plurality of segments in the codeword for at least one predetermined sequence; and v) encoding a scanned segment when the predetermined sequence is found in the segment.

According to another aspect of the present invention, a method of decoding data is provided. The data includes a codeword having a plurality of blocks. The plurality of blocks includes a first subset of blocks and a second subset of blocks. The method includes the steps of: i) scanning a plurality of segments in the codeword for a predetermined sequence; ii) decoding a scanned segment when the predetermined sequence is found in the segment; iii) decoding data in the first subset; and iv) arranging an output to include the decoded data from the first subset and the second subset.

According to still another aspect of the present invention, computer executable code to encode and decode data is provided. The code includes code to: i) divide the data into a plurality of blocks, with each block having a plurality of bits, wherein the plurality of blocks includes a first subset of blocks and a second subset of blocks; ii) encode data in the first subset; iii) arrange a codeword to include the encoded data of the first subset and the second subset; iv) scan a plurality of segments in the codeword for at least one predetermined sequence; v) encode a scanned segment when the predetermined sequence is found in the segment; vi) transmit the codeword to a memory; vii) retrieve the codeword from the memory; viii) scan a plurality of segments in the codeword for a second predetermined sequence; ix) decode a scanned segment when the second predetermined sequence is found in that segment; x) decode data of the first subset; and xi) arrange an output comprising the decoded data of the first subset and the second subset.

These and other objects, features and advantages will be apparent from the following description of the preferred embodiments of the present invention.

BRIEF DESCRIPTION OF THE DRAWINGS

The present invention will be more readily understood from a detailed description of the preferred embodiments taken in conjunction with the following figures.

FIG. 1 is a functional block diagram of an encoding/decoding system according to an embodiment of the present invention.

FIG. 2 is a functional block diagram of an encoding/decoding system according to another embodiment of the present invention.

FIG. 3 is a diagram illustrating data, which is divided into equal data blocks.

FIG. 4 is a diagram illustrating the encoding of data blocks $B_5$–$B_7$ via a 24/25 encoder to generate output data blocks $y_1$–$y_5$.

FIG. 5a is a diagram illustrating the general allocation of blocks $B_5$–$B_7$ to blocks $x_1$–$x_5$.

FIG. 5b is a diagram illustrating the allocation of data within blocks $B_5$–$B_7$ to blocks $x_1$–$x_5$.

FIG. 6 is a 24/25 encoding/decoding table according to the present invention.

FIG. 7a illustrates data blocks $y_1$–$y_5$ which contain data from the FIG. 6 table corresponding to a "11101" signature.

FIG. 7b illustrates the $y_1$14 $y_5$ data blocks of FIG. 7a, including corresponding data.

FIG. 8 is a functional diagram illustrating an optional encoding procedure of a 24/25 encoder.

FIG. 9 is a functional diagram illustrating the arrangement of a 65-bit codeword.

FIG. 10a is a flow diagram illustrating the encoding of a 65-bit codeword according to a first phase of encoding.

FIG. 10b is a flow diagram illustrating the operation of a 24/25 encoder according to the first encoding phase.

FIG. 10c is a flow diagram illustrating the operation of a second encoding phase of the present invention.

FIG. 11 is a diagram illustrating scan segments for the 65-bit codeword of FIG. 9.

FIG. 12 is a diagram illustrating the encoding for a segment including a quasi-catastrophic sequence identified in the ($B_3$, $y_4$, $B_4$) or ($B_4$, $y_5$, $B_8$) segments of FIG. 11.

FIG. 13 is a diagram illustrating the encoding for a segment including another quasi-catastrophic sequence identified in the ($B_3$, $y_4$, $B_4$) or ($B_4$, $y_5$, $B_8$) segments of FIG. 11.

FIG. 14 is a diagram illustrating the encoding for a segment including a quasi-catastrophic sequence identified in the ($B_1$, $y_2$, $B_2$) segment of FIG. 11.

FIG. 15 is a diagram illustrating the encoding for a segment including another quasi-catastrophic sequence identified in the ($B_1$, $y_2$, $B_2$) segment of FIG. 11.

FIG. 16 is a flow diagram illustrating a decoding process according to the present invention.

FIG. 17a is a diagram illustrating output blocks $y_1$–$y_5$ in connection with a decoding process of the present invention.

FIG. 17b is a diagram illustrating data from the 24/25 encoding/decoding table of FIG. 6 for the signature contained in $y_1$ of FIG. 17a.

FIG. 17c is a diagram illustrating the decoded data of FIGS. 17a and 17b, and the allocation of the decoded data to blocks $B_5$–$B_7$.

FIG. 18 is a diagram illustrating the insertion of a parity bit into a 65-bit codeword to generate a 64/66 modulation code.

FIG. 19 is a functional block diagram illustrating parity bit insertion according to the principles of the present invention.

FIG. 20 is a block diagram illustrating an implementation of a precoding function $1/(1+D^2)$.

FIG. 21a is a functional block diagram of an encoder.

FIG. 21b is a functional block diagram of a decoder.

DETAILED DESCRIPTION OF THE PREFERRED EMBODIMENTS

The preferred embodiments will be described with respect to RLL coding for a magnetic storage device having a hard disk read/write channel. However, as will be appreciated by those skilled in the art, the inventive apparatus and methods are also applicable to other storage devices and/or to other system components requiring data compression or data encoding.

FIG. 1 is a functional block diagram illustrating system 1, which includes a write path and a read path. On the write path, user data is provided to outer coder 2 (e.g., an error correcting coder (ECC)). The data (encoded by the outer coder 2) is provided to modulation code encoder 3. Modulation code encoder 3 encodes the data into a code, such as a RLL modulation code. Modulation code encoder 3 limits sequences which can degrade system performance (e.g., the performance of a Viterbi module and/or a Phase Lock Loop (PLL)). The encoded data is provided to a precoder 4. The precoded data is provided to waveform generator 5, which writes the data to media 6. Media 6 is preferably magnetic media.

On the read path, encoded data is provided from media 6 to analog front end 7. The data is converted to digital data via an analog-to-digital converter (A/D) 8. The digital data is preferable provided to digital front end 9, Viterbi detector 10, postcoder 11, and to modulation code decoder 12. Preferably, the decoded data is provided from the modulation code decoder 12 to an outer code decoder 13. Of course, system 1 could include additional components, such as signal processing components, error detection or correction components, memory modules such as RAM or ROM, and so forth.

FIG. 2 is a functional block diagram illustrating a storage system 21, which includes a cyclic encoder 23 and a post-processor decoder 30, according to an embodiment of the present invention. User data (e.g., binary data) is passed from ECC 20, to modulation code encoder 22. Modulation coder encoder 22 encodes the data into a code, such as a RLL modulation code. Modulation code encoder 22 limits sequences which can degrade system performance (e.g., the performance of a Viterbi module and/or a Phase Lock Loop (PLL)). The modulation coding is carried out in the NRZI domain (e.g., prior to precoding). If a $1/(1+D^2)$ precoder is used, the modulation code encoder 22 preferably prevents the possible occurrence of two types of problematic data sequences; namely, a consecutive sequence of zeros (e.g., "0000 . . . 0000") and a quasi-catastrophic sequence (e.g., X0X0 . . . X0X0, where X is either 1 or 0). These two types of problematic data sequences are preferably corrected, respectively, in two phases.

The RLL encoded data is provided to precoder 24, optionally via parity/cyclic encoder 23. Parity/cyclic encoder 23 inserts a parity bit, as is explained in even further detail below. In a preferred embodiment, precoder 24 maps the encoded data according to a function $1/(1+D^2)$. The data is then provided to channel 26. Channel 26 is preferably a storage medium, such as a magnetic or optical medium.

In a reproducing process, modulation encoded data can be detected from channel 26 through Viterbi detector 28. The data is provided from Viterbi detector 28 to ECC 36 through post-processor decoder 30, mapping function 32 (e.g., $(1+D^2)$), and modulation code decoder 34. The post-processor 30 attempts to correct for burst errors made by the Viterbi detector 28. The modulation code decoder 34 is the inverse of modulation code encoder 22.

FIG. 21a illustrates a functional block diagram of various encoding modules/processes of an encoder according to the present invention. With reference to FIG. 21a, data is divided by a divider 41, and then is provided to a first encoding module 42. For example, first encoding module 42 may include a 24/25 encoder 40 as discussed below. Encoded data is passed to an arranger 43 (e.g., which may arrange a codeword as shown in FIG. 9). The encoded data is preferably scanned for quasi-catastrophic sequence by scanner 44. If a catastrophic sequence is identified, the data is provided to second encoder 45 (e.g., which may encode the data according to the discussion in phase two, below).

FIG. 21b illustrates a functional block diagram of various decoding modules/processes of a decoder according to the present invention. Encoded data is scanned by scanner 46 and passed to a first decoder 47 when quasi-catastrophic encoded sequences are found. The first decoder 47 decodes segments which have been encoded to prevent catastrophic sequences. A second decoder 48 decodes the codeword to recover data. The arranger 49 constructs or arranges the data into a decoded form (e.g., into an original form).

As will be appreciated, one of ordinary skill in the art would be readily able to embody the modules shown in FIGS. 21a and 21b in discrete electronic circuitry, integrated circuitry, computer executable software code, and/or in a combination thereof, in view of the present disclosure. Also, as will be appreciated by those skilled in the art, the various modules illustrated in FIGS 21a and 21b may be combined into one or more modules.

Encoders 3 and 22 shown in FIGS. 1 and 2, respectively, each generate a modulation code. For example, the encoders 3 and 22 generate a 64/65 modulation code. A 64/65 modulation code converts 64 bits of non-encoded data into 65 bits of encoded data. The resulting 65 bits is collectively referred to as a "codeword." The 64/65 modulation code preferably satisfies a (0, G/I) constraint, where G is a maximum number of consecutive zeros after a RLL encoder, and I is the maximum number of consecutive zeros in odd/even interleave (e.g., a "quasi-catastrophic" sequence). In the preferred embodiment, the 64/65 modulation code satisfies a (0, 16/19) constraint.

Encoding is preferably accomplished in two primary phases. In phase one, a 64-bit data string is encoded with a 64/65 code limiting runs of zeros (e.g., satisfying the "G" constraint). Phase two limits quasi-catastrophic sequences (e.g., satisfying the "I" constraint). Throughout the following discussion the leftmost bit in illustrated data blocks (or a "string" of bits "blocked" together) is the least significant bit (LSB). Also an "X" represents a bit having either a zero (0) or one (1) value.

Phase One

In phase one, a string of binary data is preferably provided to the inventive encoders 3 or 22. With reference to the flow diagram illustrated in FIG. 10*a*, the data string is divided into blocks (step S1). For example, as shown in FIG. 3, a 64-bit data string is divided into eight (8) equal blocks $B_1$–$B_8$, with each block $B_i$ including eight bits of data. A 24/25 encoder 40 encodes a sub-set of the data into a 25-bit codeword (step S2). The sub-set preferably includes three (3) $B_i$ data blocks with each block having 8 bits. Once the 25-bit codeword is obtained, a 65-bit codeword is constructed or arranged (step S3) by, for example, interleaving unencoded bytes with sub-blocks of coded bytes.

The 24/25 encoding is further explained with reference to the flow diagram shown in FIG. 10*b*, and to the other corresponding figures. In the preferred embodiment, and as shown in FIG. 4, the subset of equal blocks includes blocks $B_5$–$B_7$ (step S10). The 24/25 encoder 40 provides a 25-bit codeword via five (5) output blocks $y_1$–$y_5$, as shown in FIG. 4. Each $y_i$ output block includes five (5) bits of data. The 24/25 encoder 40 preferably prevents any output block $y_i$ from including all zeros (i.e., "00000"). Such a 24/25 code is feasible since it allows for $(2^5-1)^5$ codewords (i.e., 28,629,151 codewords), while only $2^{24}$ codewords (i.e., 16,777,216 codewords) are used to account for all possible data sequences of length 24.

As shown in FIG. 5*a*, the 24/25 encoder 40 preferably allocates (or subdivides) the data contained in blocks $B_5$–$B_7$ to five (5) blocks $x_1$–$x_5$ (step S11 in FIG. 10*b*). In the preferred embodiment, blocks $x_1$–$x_4$ each include five (5) data bits, while block $x_5$ includes four (4) data bits, as shown in FIG. 5*b*.

After the data in the $B_5$–$B_7$ blocks is allocated to the $x_1$–$x_5$ blocks, the 24/25 encoder 40 determines a "signature" for the $x_1$–$x_5$ blocks according to a function $S_i$ (step S12 of FIG. 10*b*). Function $S_i$ is defined to be one (1) if all bits in an individual block $x_i$ are zero, and is defined to be zero (0) if there is at least one non-zero bit in an individual block $x_i$. A signature string "s" represents the signature of a group of $x_1$–$x_5$ blocks. For example, string "s" includes ($S_1$, $S_2$, $S_3$, $S_4$, $S_5$), with $S_i$ corresponding respectively to the signature of $x_i$ for the group of $x_1$–$x_5$ blocks. The signature of the $x_1$–$x_5$ blocks shown in FIG. 5*b* is (1, 1, 1, 0, 1), since blocks $x_1$, $x_2$, $x_3$, and $x_5$ include only zero bits and $x_4$ includes at least one non-zero bit.

The encoding of ($x_1$, $x_2$, $x_3$, $x_4$, $x_5$) is preferably accomplished with the aid of a 24/25 encoding/decoding table shown in FIG. 6 (step S13 of FIG. 10*b*). The encoding table also assists in the recovery of the original data.

In the FIG. 6 table, column "$S_1$ $S_2$ $S_3$ $S_4$ $S_5$" corresponds to the collective signature of a group of $x_1$–$x_5$ blocks, and columns "$y_1$," "$y_2$," "$y_3$," "$y_4$," and "$y_5$" correspond, respectively, to an output (e.g., an output block) of the 24/25 encoder. In the FIG. 6 table, "s" represents the signature of a group of $x_1$–$x_5$ blocks, and "free" indicates that a placeholder can be used for the respective output. In the preferred embodiment, a data string of "11101" is used as the placeholder. However, other bit combinations can be used for the "free" data as long as the five (5) bit string (or bit pattern) has at least one non-zero bit.

Returning to FIG. 5*b*, the illustrated group of $x_1$–$x_5$ blocks has a "11101" signature. A signature is used to index into the 24/25 encoding/decoding table to find the encoding for the group of $x_1$–$x_5$ blocks. Data for output blocks $y_1$–$y_5$ is determined according to the table (step S14. For example, FIG. 7*a* illustrates the table data for the $y_1$–$y_5$ output blocks that correspond to a group of $x_1$–$x_5$ blocks having a "11101" signature. In particular, for the group of $x_1$–$x_5$ blocks with a "11101" signature, output blocks $y_1$–$y_5$ contain data of "s," "free," "free," "$x_1$," and "1110,1," respectively. FIG. 7*b* illustrates the respective digital output data for the output blocks $y_1$–$y_5$ shown in FIG. 7*a*. FIGS. 7*a* and 7*b* correspond to the input data shown in FIG. 5*b*.

As shown in FIG. 6, for input data having a "00001" signature, the signature is preferable not directly encoded into the codeword. Instead, the $y_1$–$y_5$ output correspond respectively to $x_1$, $x_2$, $x_3$, $x_4$ and 0000,1.

According to the 24/25 encoder, 24 bits of data are encoded into a 25- bit codeword.

As an optional 24/25 encoding technique, the output blocks $y_1$–$y_5$ can be even further encoded. Such optional encoding serves to minimize the probability of long bursts of error propagation by protecting the $y_1$ and $y_5$ data blocks. As will be described below, the $y_1$ and $y_5$ data blocks are used as a blueprint when decoding the $y_i$ output. Accordingly, protecting this data further reduces the likelihood of long error propagation.

FIG. 8 illustrates this optional 24/25 encoding technique. Data blocks $y_1$ and $y_2$, and $y_3$ and $y_5$, are respectively swapped as shown in FIG. 8. As a further optional encoding technique, the most significant bit (MSB) of new block $y_3$ (e.g., bit $y_3[5]$, which is former bit $y_5[5]$) is moved into the least significant bit position of the $y_3$ block, as follows:

$$y_3[1]\ y_3[2]\ y_3[3]\ y_3[4]\ y_3[5]{=}y_3[5]\ y_3[1]\ y_3[2]\ y_3[3]\ y_3[4]$$

Arranging the MSB of former block $y_5$ in this manner further protects the ability to decode the $y_i$ outputs.

Once the output blocks $y_1$–$y_5$ are obtained (with or without the FIG. 8 optional encoding), a 65-bit codeword is preferably constructed or arranged. This process corresponds with step S3 in FIG. 10*a*. Preferably, as shown in FIG. 9, the codeword is pieced together in the following sequence: $y_1$, $B_1$, $y_2$, $B_2$, $y_3$, $B_3$, $y_4$, $B_4$, $y_5$, $B_8$.

Phase Two

Phase two of the 64/65 encoding removes possible quasi-catastrophic sequences (i.e., satisfying the "I" constraint), while still preferably preserving the zero (or "G") constraint obtained in phase one. As seen through a $y_i$ window (or block), quasi-catastrophic sequences can be categorized into two categories or types (i.e., "0X0X0"" and "X0X0X," where X is either one (1) or zero (0)). These two types of sequences will be generally referred to as type I and type II, respectively.

The phase two encoding will be further described with reference to the flow diagram illustrated in FIG. 10*c*, and the other corresponding figures. Once a codeword is constructed (e.g., as shown in FIG. 9), it is partially scanned (e.g., observed) for quasi-catastrophic sequences (step S20 in FIG. 10*c*). In a preferred embodiment, the scanned segments are ($B_1$, $y_2$, $B_2$), ($B_3$, $y_4$, $B_4$), and ($B_4$, $y_5$, $B_8$), as shown in FIG. 11. These segments are chosen to ensure a sufficient (0, G/I) constraint. Each scanned segment is preferably 21 bits long. The encoders 3 and 22 preferably scan the ($B_1$, $y_2$, $B_2$) segment first, and then the ($B_3$, $y_4$, $B_4$), and ($B_4$, $y_5$, $B_8$) segments. Generally, the segments are scanned to determine whether any quasi-catastrophic sequences are contained therein (step S21). If quasi-catastrophic sequences are not found in the codeword segments, no further encoding is needed and the codeword is output (step 22). If a quasi-catastrophic sequence is found, however, the codeword is further encoded (step 23).

The scanning and coding features for the ($B_1$, $y_2$, $B_2$) segment will now be described with respect to FIGS. 14 and 15. If a type I event (e.g., XX0X0X0X 0X0X0 X0XXXXXX, where X is either a one or a zero) is observed, the encoding process shown in FIG. 14 is preferably carried out. With reference to FIG. 14, bit $B_1[5]$ is switched with bit $y_2[2]$, and $B_1[7]$ is switched with bit $y_2[4]$. Bit $B_2[1]$ is moved (e.g., copied or its value is otherwise transferred) to bit position $B_2[2]$, and then bit $B_2[1]$ is set to one (1) as an indicator bit.

If a type II event (e.g., XXX0X0X0 X0X0X 0X0XXXXX, where X is either a one or a zero) is observed during the scan of the ($B_1$, $y_2$, $B_3$) segment, the encoding process shown in FIG. 15 is preferably carried out. With reference to FIG. 15, bit $B_1[4]$ is switched with bit $y_2[1]$, and bit $B_1[6]$ is switched with bit $y_2[3]$. Bit $B_1[8]$ is switched with $y_2[5]$, and bit $B_2[2]$ is moved (e.g., copied or its value is otherwise transferred) to bit position $B_2[3]$. Bit $B_2[2]$ is then set to one (1). The indicator bit $B_2[1]$ is already zero (0) in such a sequence.

The scanning and coding features for the ($B_3$, $y_4$, $B_4$) and ($B_4$, $y_5$, $B_8$) segments will be further described with respect to FIGS. 12 and 13. Each segment is initially scanned. If a type I event (e.g., 0X0X0X0X 0X0X0 X0XXXXXX, where X is either one or zero) is found in a segment, the encoding process shown in FIG. 12 is preferably carried out for that segment. With reference to FIG. 12, bit $B_i[8]$ is moved (e.g., copied or its value is otherwise transferred) to bit position $B_i[1]$, and $B_i[8]$ is set to one (1). Bit $B_i[3]$ is switched with bit $y_{i+1}[2]$, and bit $B_i[5]$ is switched with bit $y_{i+1}[4]$. Bit $B_{i+1}[2]$ (or bit $B_8[2]$) is also set to one (1) to prevent degradation of the zero constraint obtained earlier. Bit $B_i[7]$, which is zero (0) for such a sequence, also serves as an indicator bit. The remaining bits are unchanged.

If a type II event (e.g., X0X0X0X0 X0X0X 0XXXXXXX, where X is either a one or a zero) is found during the scan of the ($B_3$, $y_4$, $B_4$) or ($B_4$, $y_5$, $B_8$) segments, the encoding process shown in FIG. 13 is preferably carried out for that segment. With reference to FIG. 13, bit $B_i[2]$ is switched with bit $y_{i+1}[1]$, and bit $B_i[4]$ is switched with bit $y_{i+1}[3]$. Bit $B_i[6]$ is switched with bit $y_{i+1}[5]$, and bit $B_i[7]$ is moved (e.g., copied or its value is otherwise transferred) to bit position $B_i[8]$. Bit $B_i[7]$ is then set to one (1) as an indicator bit. Bit $B_{i+1}[1]$ (or bit $B_8[1]$) is also set to one (1) to ensure that the appropriate zero constraint is satisfied. The remaining bits are unchanged.

Accordingly, quasi-catastrophic sequences can be limited with such encoding.

Decoding

The decoders 12 and 30 shown in FIGS. 1 and 2, respectively, provide inverse decoding according to their respective encoder 3 or 22. Generally, this means that the decoder understands the code or otherwise has a key to decoding the encoded data. For example, the decoder is aware of the sequence of output blocks as shown in FIG. 9, or is otherwise constructed to decode such encoding. The decoder can reorder the blocks and/or convert the encoded data to the corresponding original data.

Since the encoder preferably scans the ($B_1$, $y_2$, $B_2$) segment before the ($B_3$, $y_4$, $B_4$) and ($B_4$, $y_5$, $B_8$) segments, the decoder preferably checks the scans in the reverse order. As discussed above, a property of the 24/25 encoding is that a $y_i$ block contains at least one non-zero bit. Accordingly, from the decoding perspective, a decoder recognizes that some form of quasi-catastrophic encoding has occurred for the ($b_3$, $y_4$, $B_4$) and/or ($B_4$, $y_5$, $B_8$) segment when the $y_{i+1}$ block contains all zeros. The decoder then can look to the $B_i[7]$ bit to determine the type of quasi-catastrophic encoding that has occurred when the $y_{i+1}$ block contains all zeros. If this bit is zero (0), for example, the decoder recognizes that type I catastrophic encoding has occurred. The decoder can then decode the codeword according to the inverse method as was described above with respect to FIG. 12.

Alternatively, if the $B_i[7]$ bit has a value of one (1) the decoder recognizes that type II catastrophic encoding has occurred. The decoder can decode the codeword according to an inverse method as was described above with respect to FIG. 13.

As discussed above, a property of the 24/25 encoding is that the $y_2$ block contains at least one non-zero bit. Accordingly, from the decoding perspective, a decoder recognizes that quasi-catastrophic encoding has occurred in the ($B_1$, $y_2$, $B_2$) segment when the $y_2$ block contains all zeros. If the $y_2$ block contains all zeros, the decoder can look to the $B_2[1]$ bit as an indicator. If this bit is one (1), the decoder recognizes that type I catastrophic encoding has occurred for the ($B_1$, $y_2$, $B_2$) segment. The decoder can then decode the codeword according to an inverse method as was described above with respect to FIG. 14.

Alternatively, if the $B_2[1]$ indicator bit is zero, the decoder recognizes that type II catastrophic encoding has occurred. The decoder can then decode the codeword according to an inverse method as was described above with respect to FIG. 15.

To decode the 24/25 encoded $y_1$–$y_5$ blocks, the $y_i$ blocks are preferably extracted or otherwise identified from the 65-bit codeword. To decode the $y_i$ blocks, a decoder preferably utilizes the table shown in FIG. 6. Initially, the most significant bit (MSB) of the $y_5$ block is viewed (or determined). Of course, if the optional 24/25 encoding technique shown in FIG. 8 is employed, the least significant bit (LSB) of the $y_3$ block is viewed (or determined), and the $y_3$ data is shifted. Alternatively, when this optional encoding technique has been employed, the decoder can decode the codeword to the point where the original $y_1$–$y_5$ blocks are recovered.

With reference to the flow chart shown in FIG. 16, the decoder determines whether the most significant $y_5$ bit is a zero (step S31). A zero (0) $y_5$ MSB corresponds to the "00000" signature shown in the FIG. 6 table. When the most significant $y_5$ bit is zero, the original data sequence $x_1$–$x_5$ is contained, respectively, in the output blocks $y_1$–$y_5$. Accordingly, the first 24 bits of the $y_1$–$y_5$ output blocks are provided as the decoded data sequence, as shown in step S32.

If the most significant $y_5$ bit is non-zero, the decoder determines whether the $y_5$ block contains data corresponding to "00001" (step S33). If $y_5$ matches "00001," then "00001" is used as the signature for decoding (step S35).

Otherwise, the signature is determined (step S34) from the blocks $y_1$–$y_5$. In the preferred embodiment, and as shown in FIG. 7b, the signature (s) of a group of $x_1$–$x_5$ blocks is encoded as the data of the $y_1$ block when the $y_5$ MSB is one (1), and the signature is not "00001." The signature is used to index into the 24/25 encoding/decoding table shown in FIG. 6 (step S36).

Decoding a 25-bit codeword is further explained with reference to FIGS. 17a–17c. Since the most significant $y_5$ bit (highlighted by an arrow) is one (and since the $y_5$ data "11101" does not match "00001") in the FIG. 17a example, it is known that the block $y_1$ data was encoded with signature data, which in this case is "11101." This signature (i.e., "11101") is used to index into the 24/25 encoding/decoding table shown in FIG. 6. The corresponding 24/25 encoding/decoding table data for a signature of "11101" is reproduced in block form in FIG. 17b.

Each bit $S_1$ in the signature respectively corresponds to a decoded block $X_i'$. For example, $S_1$–$S_5$ (e.g., 1,1,1,0,1 in the FIG. 17a example) respectively correspond to the $x_1'$–$x_5'$ decoded blocks shown in FIG. 17c. A decoded block $x_i'$ is filled with (or its bit values' are set to) zeros (e.g., "00000") when the respective signature $S_i$ is one (1). For example, $x_1'$, $x_2'$, $x_3'$, and $x_5'$, are filled with zeros since $S_1$, $S_2$, $S_3$ and $S_5$ are each 1, as shown in FIGS. 17a–17c. Since $S_4$ is zero, a location for the $x_4'$ data is obtained from the FIG. 6 table. In this case the table indicates that the $x_4'$ data is located in $y_4$. The $y_4$ data is provided as the $x_4'$ data.

As a further example, a "00100" signature indicates that blocks $x_1'$, $x_2'$, $x_4'$, and $x_5'$ each have at least one non-zero bit and $x_3'$ has all zero bits. Accordingly, the $x_3'$ block is filled with zeros. As shown in the FIG. 6 table, data for $x_1'$, $x_2'$, $x_4'$, and $x_5'$ is located in the $y_2$, $y_3$, $y_4$ and $y_5$ blocks, respectively. Only the first four bits of $y_5$ are provided to $x_5'$.

Once the decoded blocks $x_1'$–$x_5'$ are obtained, the $B_5$–$B_7$ blocks can be reconstructed as shown in FIG. 17c. Accordingly, the original 24 bits of data (e.g., FIG. 5b) are recovered (e.g., FIG. 17c) by this decoding method and apparatus. Once the $B_5$–$B_7$ data blocks are reconstructed, the 64-bit string $B_1$–$B_8$ can also be reconstructed. Accordingly, the 65-bit codeword is decoded.

Parity/Cyclic Encoder

The cyclic encoder 23 shown in FIG. 2 generates a 64/66 modulation code for use with post-processor 30. The 64/66 code preferably satisfies a (0, 17/19) constraint. The 64/66 modulation code is generated by the insertion of a parity bit into a 65-bit codeword, for example, as encoded above. A single parity bit is preferably inserted between bits $y_3[3]$ and $y_3[4]$ prior to precoding, as shown in FIG. 18. The value of the parity bit is selected so as to make the sum of all bits in the codeword including the inserted parity bit (after the precoding) zero (0). As will be appreciated, "summing" can be achieved by modulo 2=⊕, where 1+1=0, 1+0=1, 0+1=1, and 0+0=0. The post processor 30 detects an error when the sum of all bits is non-zero (i.e., 1).

The parity bit is preferably calculated as described below. A parity insertion register D is utilized to XOR the last two synchronization mark bits in the precoded domain. The parity bit is initialized to zero (0), and is inserted into the codeword as shown in FIG. 18. The parity bit is then set to:

$$b_1 \hat{0} b_2 \hat{0} b_5 \hat{0} b_6 \hat{0} b_9 \hat{0} b_{10} \hat{0} b_{13} \hat{0} b_{14} \hat{0} \ldots \hat{0} b_{53} \hat{0} b_{54} \hat{0} b_{57} \hat{0} b_{58} \hat{0} b_{61} \hat{0} b_{62} \hat{0} b_{65} \hat{0} b_{66} \hat{0} D,$$

where $b_i$ is the $i$th bit of a codeword, starting from 1 and counting left to right, and the symbol "$\hat{0}$" is the XOR operation.

Then the parity insertion register D is reset as:

$$D = D \hat{0} b_1 \hat{0} b_2 \hat{0} b_3 \hat{0} b_4 \hat{0} b_5 \hat{0} b_6 \hat{0} \ldots \hat{0} b_{62} \hat{0} b_{63} \hat{0} b_{64} \hat{0} b_{65} \hat{0} b_{66}.$$

An example of inserting a parity bit into a five-bit codeword ($b_1$, $b_2$, $b_3$, $b_4$, $b_5$) is presented to even further explain the inventive 64/66 modulation encoding. A parity bit p is appended at the end of a five-bit codeword such that the sum (e.g., ⊕) of ($b_1$, $b_2$, $b_3$, $b_4$, $b_5$, p) after precoding is zero (0), as shown in the block diagram of FIG. 19. In this example, $1/(1+D^2)$ is implemented as shown in FIG. 20.

Variables $d_2$ and $d_1$ denote the last two bits of the precoded synchronization mark, and D is initialized with $D = d_1 \hat{0} d_2$. Then the output of the $1/(1+D^2)$ function, corresponding to the input ($b_1$, $b_2$, $b_3$, $b_4$, $b_5$, p), is given by:

$$[b_1 \hat{0} d_2, b_2 \hat{0} d_1, b_3 \hat{0} b_1 \hat{0} d_2, b_4 \hat{0} b_2 \hat{0} d_1, b_5 \hat{0} b_3 \hat{0} b_1 \hat{0} d_2, p \hat{0} b_4 \hat{0} b_2 \hat{0} d_1].$$

Setting the sum of this expression to zero (0) gives $p = (b_1 \hat{0} b_2) \hat{0} b_5 \hat{0} (d_1 \hat{0} d_2)$, where $(d_1 \hat{0} d_2)$ represents D, which is the sum of the last two precoded bits in the previous codeword.

To process the next codeword, D is reset such as: Reset $D = (b_5 \hat{0} b_3 \hat{0} b_1 \hat{0} d_2) \oplus (p \hat{0} b_4 \hat{0} b_2 \hat{0} d_1)$. Simplifying this expression yields $D = b_3 \hat{0} b_4$. This example, although expressed in terms of a five (5) bit word, illustrates the principles of a parity insertion for a 64/66 modulation code.

To decode a 64/66 codeword, the parity bit is removed, and a decoding process is carried out.

Conclusion

Accordingly, an encoding system and method capable of generating both a 64/65 modulation code and a 64/66 modulation code have been described in detail. A 24/25 encoder has also been described for use in generating these modulation codes.

While the present invention has been described with respect to what is presently considered to be the preferred embodiments, it will be understood that the invention is not limited to the disclosed embodiments. To the contrary, the invention covers various modifications and equivalent arrangements included within the spirit and scope of the appended claims. The scope of the following claims is to be accorded the broadest interpretation so as to encompass all such modifications and equivalent structures and functions.

For example, the encoders/decoders, methods, procedures, data table, and logic as described herein, can be readily embodied in customized integrated circuitry, discrete electrical components, a programmable computer, data structures and/or realized via computer executable software using known programming techniques. Such software can be stored on a computer readable medium, for example, on a floppy disk, RAM, ROM, a hard disk, removable media, flash memory, data caches, memory sticks, optical mediums, magneto-optical mediums, CD-ROMs, and so forth.

Whereas the present invention has been described with respect to storing a signature (s) in the $y_1$ block, other output $y_1$ blocks could alternatively be used for storing signature data. As a further alternative, the decoding process shown in FIGS. 17a–17c can be modified. For example, rather than decoding the codeword to the intermediate outputs $x_1'$–$x_5'$, the codeword could be directly decoded to blocks $B_5$–$B_7$. Such modifications are within the scope of the present invention.

Also, with respect to scanning segments as shown in FIG. 11, an encoder can scan a segment and then encode that segment, before moving on to scan a remaining segment. Alternatively, an encoder can first scan all three segments and then encode the segments.

Furthermore, additional processing modules may be added to the encoder and decoder illustrated in FIGS. 21a and 21b, respectively. Also, the functionality described with respect to those modules may also be combined into one or more modules.

What is claimed is:

1. A method of encoding 64 bits with a 64/65 modulation code, said method comprising the steps of:
   dividing the 64 bits into eight blocks, with each block including eight bits;
   encoding data within three of the blocks with a 24/25 modulation code;
   arranging the encoded data and the five non-encoded blocks to form a 65-bit codeword;
   scanning a plurality of segments of the codeword for predetermined bit patterns; and
   encoding a segment when a predetermined bit pattern is identified in the segment.

2. A method according to claim 1, wherein said encoding data step includes the steps of:
   dividing the three blocks into sub-blocks;
   determining a signature for each of the sub-blocks;
   indexing into a memory with a collective signature of the sub-blocks to identify the appropriate encoding for the sub-blocks, the collective signature comprising the signature of each of the sub-blocks; and
   determining output blocks according to the memory.

3. A method according to claim 2, wherein the three blocks are divided into five sub-blocks, with four of the sub-blocks including five bits and a fifth sub-block including four bits.

4. A method according to claim 3, wherein the collective signature of the sub-blocks includes five bits ($S_1$, $S_2$, $S_3$, $S_4$, $S_5$), each bit corresponding to one of the five sub-blocks, and wherein the bit value of each of $S_1$ through $S_5$ is determined according to a function $s_i$, where $s_i$ is defined to be one if all bits in a respective sub-block are zero, and is defined to be zero if there is at least one non-zero bit in the respective sub-block.

5. A method according to claim 4, wherein each of the output blocks includes at least one non-zero bit.

6. A method according to claim 5, wherein the eight blocks respectively include blocks ($B_1$, $B_2$, $B_3$, $B_4$, $B_5$, $B_6$, $B_7$, $B_8$), the output blocks respectively comprise blocks ($y_1$, $y_2$, $y_3$, $y_4$, $y_5$), the three encoded blocks respectively comprise blocks ($B_5$, $B_6$, and $B_7$), and the 65-bit codeword comprises blocks arranged in the order of:
   [$y_1$, $B_1$, $y_2$, $B_2$, $y_3$, $B_3$, $y_4$, $B_4$, $y_5$, $B_8$].

7. A method according to claim 5, wherein the output blocks respectively comprise blocks ($y_1$, $y_2$, $y_3$, $y_4$, $y_5$), and said method further comprises the steps of:
   switching the bits in output block $y_1$ with the bits in output block $y_2$; and
   switching the bits in output block $y_3$ with the bits in output block $y_5$.

8. A method according to claim 7, wherein after switching the bits of $y_3$ with the bits of $y_5$, said method further comprises the step of reordering the bits in the $y_3$ output block such that an order of the five bits comprises $y_3[5]$, $y_3[1]$, $y_3[2]$, $y_3[3]$, $y_3[4]$, where $y_3[5]$ comprises the most significant bit in the $y_3$ output block.

9. A method according to claim 3, wherein when the eight blocks respectively comprise blocks ($B_1$, $B_2$, $B_3$, $B_4$, $B_5$, $B_6$, $B_7$, $B_8$), the output blocks respectively comprise blocks ($y_1$, $y_2$, $y_3$, $y_4$, $y_5$), the three encoded blocks comprise blocks ($B_5$, $B_6$, and $B_7$), and the 65-bit codeword comprises blocks arranged as:
   [$y_1$, $B_1$, $y_2$, $B_2$, $y_3$, $B_3$, $y_4$, $B_4$, $y_5$, $B_8$].

10. A method according to claim 9, wherein the plurality of segments comprises segments ($B_1$, $y_2$, $B_2$), ($B_3$, $y_4$, $B_4$) and ($B_4$, $y_5$, $B_8$).

11. A method according to claim 10, wherein when the predetermined bit pattern in the ($B_1$, $y_2$, $B_2$) segment comprises XX0X0X0X 0X0X0 X0XXXXXX, where X is a bit having either a one or a zero value, said encoding a segment step comprises the steps of:
   switching the fifth $B_1$ bit with the second $y_2$ bit, where the first bit is the least significant bit in each block;
   switching the seventh $B_1$ bit with the fourth $y_2$ bit, where the first bit is the least significant bit in each block;
   moving the first $B_2$ bit to the second $B_2$ bit, where the first bit is the least significant bit in each block; and after said moving step,
   setting the first $B_1$ bit to one.

12. A method according to claim 10, wherein when the predetermined bit pattern in the ($B_1$, $y_2$, $B_2$) segment comprises XXX0X0X0 X0X0X 0X0XXXXX, where X is a bit having either a one or a zero value, said encoding a segment step comprises the steps of:
   switching the fourth $B_1$ bit with the first $y_2$ bit, where the first bit is the least significant bit in each block;
   switching the sixth $B_1$ bit with the third $y_2$ bit, where the first bit is the least significant bit in each block;
   switching the eighth $B_1$ bit with the fifth $y_2$ bit, where the first bit is the least significant bit in each block;
   moving the second $B_2$ bit to the third $B_2$ bit, where the first bit is the least significant bit in each block; and after said moving step,
   setting the second $B_2$ bit to one (1).

13. A method according to claim 10, wherein when the predetermined bit pattern in the ($B_3$, $y_4$, $B_4$) segment comprises X0X0X0X0 X0X0X 0XXXXXXX, where X is a bit having either a one or a zero value, said encoding a segment step comprises the steps of:
   switching the second $B_3$ bit with the first $y_4$ bit, where the first bit is the least significant bit in each block;
   switching the fourth $B_3$ bit with the third $y_4$ bit, where the first bit is the least significant bit in each block;
   switching the sixth $B_3$ bit with the fifth $y_4$ bit, where the first bit is the least significant bit in each block;
   setting the first $B_4$ bit to one (1); and
   moving the seventh $B_3$ bit to the eighth $B_3$ bit, where the first bit is the least significant bit in each block; and after said moving step setting the seventh $B_3$ bit to one (1).

14. A method according to claim 10, wherein when the predetermined bit pattern in the ($B_4$, $y_5$, $B_8$) segment comprises X0X0X0X0 X0X0X 0XXXXXXX, where X is a bit having either a one or a zero value, said encoding step comprises the steps of:
   switching the second $B_4$ bit with the first $y_5$ bit, where the first bit is the least significant bit in each block;
   switching the fourth $B_4$ bit with the third $y_5$ bit, where the first bit is the least significant bit in each block;
   switching the sixth $B_4$ bit with the fifth $y_5$ bit, where the first bit is the least significant bit in each block;
   setting the first $B_8$ bit to one;
   moving the seventh $B_4$ bit to the eighth $B_4$ bit, where the first bit is the least significant bit in each block; and after said moving step,
   setting the seventh $B_4$ bit to one (1).

15. A method according to claim 10, wherein when the predetermined bit pattern in the ($B_3$, $y_4$, $B_4$) segment comprises 0X0X0X0X 0X0X0 X0XXXXXX, where X is a bit having either a one or a zero value, said encoding a segment step comprises the steps of:
- moving the eighth $B_3$ bit to the first $B_3$ bit, where the first bit is the least significant bit in each block, and after moving the eighth bit, setting the eighth $B_3$ bit to one (1);
- switching the third $B_3$ bit with the second $y_4$ bit, where the first bit is the least significant bit in each block;
- switching the fifth $B_3$ bit with the fourth $y_4$ bit, where the first bit is the least significant bit in each block; and
- setting the second $B_4$ bit to one (1), where the first bit is the least significant bit in each block.

16. A method according to claim 10, wherein when the predetermined bit pattern in the ($B_4$, $y_5$, $B_8$) segment comprises 0X0X0X0X 0X0X0 X0XXXXXX, where X is bit having either a one or a zero value, said encoding a segment step comprises the steps of:
- moving the eighth $B_4$ bit to the first $B_4$ bit, where the first bit is the least significant bit in each block, and after moving the eighth $B_4$ bit setting the eighth $B_4$ bit to one (1);
- switching the third $B_4$ bit with the second $y_5$ bit, where the first bit is the least significant bit in each block;
- switching the fifth $B_4$ bit with the fourth $y_5$ bit, where the first bit is the least significant bit in each block;
- setting the second $B_8$ bit to one (1), where the first bit is the least significant bit in a block; and
- setting the eighth $B_4$ bit to one (1), where the first bit is the least significant bit in a block.

17. A method according to claim 1, further comprising the step of mapping the codeword via a function of $1/(1+D^2)$, where D is a delay operator.

18. A method according to claim 1, wherein the modulation code satisfies a (0, 16/19) constraint, where 16 is the maximum number of consecutive zeros after encoding, and 19 is the maximum number of consecutive zeros in an odd/even interleave.

19. A method according to claim 1, further comprising the step of inserting a parity bit into the 65-bit codeword to generate a 64/66 modulation code.

20. A method according to claim 19, further comprising the step of setting the value of the parity bit so that the sum all bits in the codeword, including the inserted parity bit, is zero.

21. A method according to claim 20, wherein the sum is defined by modulo 2≡⊕, so that 1+1=0, 1+0=1, 0+1=1, and 0+0=0.

22. A method according to claim 20, wherein the parity bit is set according to the steps of:
- initializing the parity bit to zero (0);
- setting the parity bit to: $b_1\hat{\,}b_2\hat{\,}b_5\hat{\,}b_6\hat{\,}b_9\hat{\,}b_{10}\hat{\,}b_{13}\hat{\,}b_{14}\hat{\,}$ ... $\hat{\,}b_{53}\hat{\,}b_{54}\hat{\,}b_{57}\hat{\,}b_{58}\hat{\,}b_{61}\hat{\,}b_{62}\hat{\,}b_{65}\hat{\,}b_{66}\hat{\,}D$, where $b_i$ is the $_i$th bit of a codeword, starting from 1 and counting left to right, the symbol "^" is the XOR operation, and D is a parity insertion variable; and then
- resetting the parity insertion register D to: $D=D\hat{\,}b_1\hat{\,}b_2\hat{\,}b_3\hat{\,}b_4\hat{\,}b_5\hat{\,}b_6\hat{\,}$ ... $\hat{\,}b_{62}\hat{\,}b_{63}\hat{\,}b_{64}\hat{\,}b_{65}\hat{\,}b_{66}$.

23. A data transmission system comprising:
- an encoder to: i) divide data into data blocks, with each block having a plurality of bits, the data blocks grouped in a first subset and a second subset, ii) encode data of the first subset with a run length limited code, iii) arrange a codeword to comprise the data from the encoded first subset and the second subset, iv) scan a plurality of segments in the codeword for quasi-catastrophic sequences, and v) encode a scanned segment when a quasi-catastrophic sequence is found in that segment;
- a transmitter to transmit the codeword to a storage medium;
- a detector to detect the codeword from the storage medium; and
- a decoder to: i) scan the plurality of segments in the codeword for quasi-catastrophic encoding, ii) decode a scanned segment when a quasi-catastrophic encoded segment is found in that segment, iii) decode the run length limited code of the data from the first subset, and iv) arrange a plurality of blocks comprising the decoded data and the second subset.

24. A data transmission system according to claim 23, further comprising:
- a precoder to map the codeword encoded by said encoder according to a function of $1/(1+D^2)$, where D is a delay operator; and
- a post-coder which maps the detected encoded codeword according to a function of $(1+D^2)$, where D is the delay operator, wherein said detector comprises a viterbi detector to detect the codeword from the storage medium.

25. A data transmission system according to claim 24, further comprising a post-processor decoder communicating with said viterbi detector and said post-coder.

26. A data transmission system according to claim 25, further comprising an error correcting coder communicating with said encoder.

27. A data transmission system according to claim 26, further comprising a cyclic encoder communicating with said encoder and said precoder.

28. A method of encoding data comprising the steps of:
- dividing the data into a plurality of blocks, with each block having a plurality of bits, wherein the plurality of blocks comprises a first subset of blocks and a second subset of blocks;
- encoding data in the first subset;
- arranging a codeword to comprise the encoded data of the first subset and the second subset;
- scanning a plurality of segments in the codeword for at least one predetermined sequence; and
- encoding a scanned segment when the predetermined sequence is found in the segment.

29. A method according to claim 28, wherein said encoding data step comprises the steps of:
- dividing the first subset into sub-blocks;
- determining a signature for each of the sub-blocks;
- indexing into a memory with a collective signature of the sub-blocks to identify encoding details for the sub-blocks, the collective signature comprising the signature of each of the sub-blocks; and
- determining output blocks according to the memory.

30. A method according to claim 29, wherein the first subset is divided into five sub-blocks, with four of the sub-blocks including five bits and a fifth sub-block including four bits.

31. A method according to claim 29, wherein the collective signature of the sub-blocks comprises n signature bits, where n comprises the number of sub-blocks, and wherein each signature bit corresponds respectively to one of the sub-blocks, and wherein the bit value of each signature bit is determined according to a function s, where s is defined to be one if all bits in a respective sub-block are zero, and is defined to be zero if there is at least one non-zero bit in the respective sub-block.

32. A method according to claim 31, wherein each of the output blocks includes at least one non-zero bit.

33. A method according to claim 32, wherein the plurality of blocks respectively comprise blocks ($B_1$, $B_2$, $B_3$, $B_4$, $B_5$, $B_6$, $B_7$, $B_8$), the output blocks respectively comprise blocks ($y_1$, $y_2$, $y_3$, $y_4$, $y_5$), the first subset comprises blocks ($B_5$, $B_6$, and $B_7$), the second subset comprises blocks ($B_1$, $B_2$, $B_3$, $B_4$, $B_8$), and the codeword comprises blocks arranged in the order of:

[$y_1$, $B_1$, $y_2$, $B_2$, $y_3$, $B_3$, $y_4$, $B_4$, $y_5$, $B_8$].

34. A method according to claim 33, wherein the plurality of segments comprises segments ($B_1$, $y_2$, $B_2$), ($B_3$, $y_4$, $B_4$) and ($B_4$, $y_5$, $B_8$).

35. A method according to claim 28, further comprising the step of mapping the codeword via a function of $1/(1+D^2)$, where D is a delay operator.

36. A method according to claim 35, further comprising the step of inserting a parity bit into the codeword.

37. A method according to claim 36, further comprising the step of setting the value of the parity bit so that the sum all bits in the codeword, including the inserted parity bit, is zero.

38. A method according to claim 28, wherein the codeword comprises 65 bits and the codeword satisfies a (0, 16/19) constraint, where 16 is the maximum number of consecutive zeros after encoding, and 19 is the maximum number of consecutive zeros in an odd/even interleave.

39. An apparatus to encode data comprising:
   means for dividing the data into a plurality of blocks, with each block having a plurality of bits, wherein the plurality of blocks comprises a first subset of blocks and a second subset of blocks;
   means for encoding data in the first subset;
   means for arranging a codeword to comprise the encoded data of the first subset and the second subset;
   means for scanning a plurality of segments in the codeword for at least one predetermined sequence; and
   means for encoding a scanned segment when the predetermined sequence is found in the segment.

40. An apparatus according to claim 39, wherein said data encoding means: i) divides the first subset into sub-blocks; ii) determines a signature for each of the sub-blocks; iii) indexes into a memory with a collective signature of the sub-blocks to identify encoding details for the sub-blocks, the collective signature comprising the signature of each of the sub-blocks; and iv) determines output blocks according to the memory.

41. An apparatus according to claim 40, wherein the first subset is divided into five sub-blocks, with four of the sub-blocks including five bits and a fifth sub-block including four bits.

42. An apparatus according to claim 40, wherein the collective signature of the sub-blocks comprises n signature bits, where n comprises the number of sub-blocks, and wherein each signature bit corresponds respectively to one of the sub-blocks, and wherein the bit value of each signature bit is determined according to a function s, where s is defined to be one if all bits in a respective sub-block are zero, and is defined to be zero if there is at least one non-zero bit in the respective sub-block.

43. An apparatus according to claim 42, wherein each of the output blocks includes at least one non-zero bit.

44. An apparatus according to claim 43, wherein the plurality of blocks respectively comprise blocks ($B_1$, $B_2$, $B_3$, $B_4$, $B_5$, $B_6$, $B_7$, $B_8$), the output blocks respectively comprise blocks ($y_1$, $y_2$, $y_3$, $y_4$, $y_5$), the first subset comprises blocks ($B_5$, $B_6$, and $B_7$), the second subset comprises blocks ($B_1$, $B_2$, $B_3$, $B_4$, $B_8$), and the codeword comprises blocks arranged in the order of:

[$y_1$, $B_1$, $y_2$, $B_2$, $y_3$, $B_3$, $y_4$, $B_4$, $y_5$, $B_8$].

45. An apparatus according to claim 44, wherein the plurality of segments comprises segments ($B_1$, $y_2$, $B_2$), ($B_3$, $y_4$, $B_4$) and ($B_4$, $y_5$, $B_8$).

46. An apparatus according to claim 39, further comprising means for mapping the codeword via a function of $1/(1+D^2)$, where D is a delay operator.

47. An apparatus according to claim 46, further comprising means for inserting a parity bit into the codeword.

48. An apparatus according to claim 47, wherein the value of the parity bit is set so that the sum all bits in the codeword, including the inserted parity bit, is zero.

49. An apparatus according to claim 39, wherein the codeword comprises 65 bits and the codeword satisfies a (0, 16/19) constraint, where 16 is the maximum number of consecutive zeros after encoding, and 19 is the maximum number of consecutive zeros in an odd/even interleave.

50. An apparatus to encode data comprising:
   a divider to divide the data into a plurality of blocks, with each block having a plurality of bits, wherein the plurality of blocks comprises a first subset of blocks and a second subset of blocks;
   a first encoder to encode data in the first subset;
   an arranger to arrange a codeword to comprise the encoded data of the first sub-set and the second subset;
   a scanner to scan a plurality of segments in the codeword for at least one predetermined sequence; and
   a second encoder to encode a scanned segment when the predetermined sequence is found in the segment.

51. An apparatus according to claim 50, wherein said first encoder: i) divides the first subset into sub-blocks; ii) determines a signature for each of the sub-blocks; iii) indexes into a memory with a collective signature of the sub-blocks to identify encoding details for the sub-blocks, the collective signature comprising the signature of each of the sub-blocks; and iv) determines output blocks according to the memory.

52. An apparatus according to claim 51, wherein the first subset is divided into five sub-blocks, with four of the sub-blocks including five bits and a fifth sub-block including four bits.

53. An apparatus according to claim 51, wherein the collective signature of the sub-blocks comprises n signature bits, where n comprises the number of sub-blocks, and wherein each signature bit corresponds respectively to one of the sub-blocks, and wherein the bit value of each signature bit is determined according to a function s, where s is defined to be one if all bits in a respective sub-block are zero, and is defined to be zero if there is at least one non-zero bit in the respective sub-block.

54. An apparatus according to claim 53, wherein each of the output blocks includes at least one non-zero bit.

55. An apparatus according to claim 54, wherein the plurality of blocks respectively comprise blocks ($B_1$, $B_2$, $B_3$, $B_4$, $B_5$, $B_6$, $B_7$, $B_8$), the output blocks respectively comprise blocks ($y_1$, $y_2$, $y_3$, $y_4$, $y_5$), the first subset comprises blocks ($B_5$, $B_6$, and $B_7$), the second subset comprises blocks ($B_1$, $B_2$, $B_3$, $B_4$, $B_8$), and the codeword comprises blocks arranged in the order of:

[$y_1$, $B_1$, $y_2$, $B_2$, $y_3$, $B_3$, $y_4$, $B_4$, $y_5$, $B_8$].

56. An apparatus according to claim 55, wherein the plurality of segments comprises segments ($B_1$, $y_2$, $B_2$), ($B_3$, $y_4$, $B_4$) and ($B_4$, $y_5$, $B_8$).

57. An apparatus according to claim 50, further comprising a precoder to map the codeword via a function of $1/(1+D^2)$, where D is a delay operator.

58. An apparatus according to claim 57, further comprising a cyclic encoder to insert a parity bit into the codeword.

59. An apparatus according to claim 58, wherein said cyclic encoder sets the value of the parity bit so that the sum all bits in the codeword, including the inserted parity bit, is zero.

60. An apparatus according to claim 50, wherein the codeword comprises 65 bits and the codeword satisfies a (0, 16/19) constraint, where 16 is the maximum number of consecutive zeros after encoding, and 19 is the maximum number of consecutive zeros in an odd/even interleave.

61. Computer executable code stored on a computer readable medium, said computer executable code comprising code to:

divide the data into a plurality of blocks, with each block having a plurality of bits, wherein the plurality of blocks comprises a first subset of blocks and a second subset of blocks;

encode data in the first subset;

arrange a codeword to comprise the encoded data of the first subset and the second subset;

scan a plurality of segments in the codeword for at least one predetermined sequence; and encode a scanned segment when the predetermined sequence is found in that segment.

62. Computer executable code according to claim 61, wherein said encoding data code comprises code to:

divide the first subset into sub-blocks;

determine a signature for each of the sub-blocks;

index into a memory with a collective signature of the sub-blocks to identify encoding details for the sub-blocks, the collective signature comprising the signature of each of the sub-blocks; and determine output blocks according to the memory.

63. Computer executable code according to claim 62, wherein the first subset is divided into five sub-blocks, with four of the sub-blocks including five bits and a fifth sub-block including four bits.

64. Computer executable code according to claim 62, wherein the collective signature of the sub-blocks comprises n signature bits, where n comprises the number of sub-blocks, and wherein each signature bit corresponds respectively to one of the sub-blocks, and wherein the bit value of each signature bit is determined according to a function s, where s is defined to be one if all bits in a respective sub-block are zero, and is defined to be zero if there is at least one non-zero bit in the respective sub-block.

65. Computer executable code according to claim 64, wherein each of the output blocks includes at least one non-zero bit.

66. Computer executable code according to claim 65, wherein the plurality of blocks respectively comprise blocks ($B_1$, $B_2$, $B_3$, $B_4$, $B_5$, $B_6$, $B_7$, $B_8$), the output blocks respectively comprise blocks ($y_1$, $y_2$, $y_3$, $y_4$, $y_5$), the first subset comprises blocks ($B_5$, $B_6$, and $B_7$), the second subset comprises blocks ($B_1$, $B_2$, $B_3$, $B_4$, $B_8$), and the codeword comprises blocks arranged in the order of:

[$y_1$, $B_1$, $y_2$, $B_2$, $y_3$, $B_3$, $y_4$, $B_4$, $y_5$, $B_8$].

67. Computer executable code according to claim 66, wherein the plurality of segments comprises segments ($B_1$, $y_2$, $B_2$), ($B_3$, $y_4$, $B_4$) and ($B_4$, $y_5$, $B_8$).

68. Computer executable code according to claim 61, further comprising code to map the codeword via a function of $1/(1+D^2)$, where D is a delay operator.

69. Computer executable code according to claim 68, further comprising code to insert a parity bit into the codeword.

70. Computer executable code according to claim 69, further comprising code to set the value of the parity bit so that the sum all bits in the codeword, including the inserted parity bit, is zero.

71. Computer executable code according to claim 61, wherein the codeword comprises 65 bits and the codeword satisfies a (0, 16/19) constraint, where 16 is the maximum number of consecutive zeros after encoding, and 19 is the maximum number of consecutive zeros in an odd/even interleave.

72. A method of decoding data, the data including a codeword having a plurality of blocks, the plurality of blocks comprising a first subset of blocks and a second subset of blocks, said method comprising the steps of:

scanning a plurality of segments in the codeword for a predetermined sequence;

decoding a scanned segment when the predetermined sequence is found in the segment;

decoding data in the first subset; and arranging an output to comprise the decoded data from the first subset and the second subset.

73. A method according to claim 72, wherein said step of decoding data in the first subset comprises the steps of:

determining an indicator bit of a first block of the first subset of blocks;

outputting all non-indicator bits in the first subset when the indicator bit is a predetermined value; and when the indicator bit is not the predetermined value, determining if the first block comprises a predetermined bit pattern;

indexing into a memory with the predetermined bit pattern when the bit pattern in the first block matches the predetermined bit pattern;

identifying a signature from one of the blocks of the first subset when the bit pattern in the first block does not match the predetermined bit pattern, and indexing into the memory with the signature; and decoding the first subset of blocks according to the memory.

74. A method according to claim 73, wherein the codeword is arranged as:

[$y_1$, $B_1$, $y_2$, $B_2$, $y_3$, $B_3$, $y_4$, $B_4$, $y_5$, $B_8$], where blocks $B_1$, $B_2$, $B_3$, $B_4$, $B_8$, $y_1$, $y_2$, $y_3$, $y_4$ and $y_5$ comprise the plurality of blocks, blocks $B_1$, $B_2$, $B_3$, $B_4$ and $B_8$ comprise the second subset of blocks, and blocks $y_1$, $y_2$, $y_3$, $y_4$ and $y_5$ comprise the first subset of blocks.

75. A method according to claim 74, wherein the plurality of segments comprise segments ($B_1$, $y_2$, $B_2$), ($B_3$, $y_4$, $B_4$) and ($B_4$, $y_5$, $B_8$).

76. A method according to claim 75, wherein segments ($B_3$, $y_4$, $B_4$) and ($B_4$, $y_5$, $B_8$) are scanned before segment ($B_1$, $y_2$, $B_2$).

77. A method according to claim 75, wherein the predetermined sequence is identified when any one of blocks $y_2$, $y_4$, and $y_5$ comprises all zero bits.

78. A method according to claim 72, wherein the codeword comprises data mapped according to a function of $1/(1+D^2)$, where D is a delay operator.

79. A method according to claim 78, wherein the codeword comprises 65 bits and the codeword satisfies a (0, 16/19) constraint, where 16 is the maximum number of consecutive zeros after encoding, and 19 is the maximum number of consecutive zeros in an odd/even interleave.

80. A method according to claim 72, further comprising the step of removing a parity bit from the codeword.

81. An apparatus to decode data, the data including a codeword having a plurality of blocks, the plurality of blocks comprising a first subset of blocks and a second subset of blocks, said apparatus comprising:
   means for scanning a plurality of segments in the codeword for a predetermined sequence;
   first means for decoding a scanned segment when the predetermined sequence is found in the segment;
   second means for decoding data in the first subset; and
   means for arranging an output comprising the decoded data from the first subset and the second subset.

82. An apparatus according to claim 81, wherein said second decoding means: i) determines an indicator bit of a first block of the first subset of blocks; ii) outputs all non-indicator bits in the first subset when the indicator bit is a predetermined value; and when the indicator bit is not the predetermined value; iii) determines if the first block comprises a predetermined bit pattern, and indexes into a memory with the predetermined bit pattern when the bit pattern in the first block matches the predetermined bit pattern; iv) identifies a signature from one of the blocks of the first subset when the bit pattern in the first block does not match the predetermined bit pattern; v) indexes into the memory with the signature, and vi) decodes the first sub-set of blocks according to the memory.

83. An apparatus according to claim 82, wherein the codeword is arranged as:
   $[y_1, B_1, y_2, B_2, y_3, B_3, y_4, B_4, y_5, B_8]$,
   where blocks $B_1, B_2, B_3, B_4, B_8, y_1, y_2, y_3, y_4$ and $y_5$ comprise the plurality of blocks, blocks $B_1, B_2, B_3, B_4$ and $B_8$ comprise the second subset of blocks, and blocks $y_1, y_2, y_3, y_4$ and $y_5$ comprise the first sub-set of blocks.

84. An apparatus according to claim 83, wherein the plurality of segments comprise segments $(B_1, y_2, B_2)$, $(B_3, y_4, B_4)$ and $(B_4, y_5, B_8)$.

85. An apparatus according to claim 84, wherein segments $(B_3, y_4, B_4)$ and $(B_4, y_5, B_8)$ are scanned before segment $(B_1, y_2, B_2)$.

86. An apparatus according to claim 84, wherein the predetermined sequence is identified when any one of blocks $y_2, y_4$, and $y_5$ comprises all zero bits.

87. An apparatus according to claim 81, wherein the codeword comprises data mapped according to a function of $1/(1+D^2)$, where D is a delay operator.

88. An apparatus according to claim 87, wherein the codeword comprises 65 bits and the codeword satisfies a (0, 16/19) constraint, where 16 is the maximum number of consecutive zeros after encoding, and 19 is the maximum number of consecutive zeros in an odd/even interleave.

89. An apparatus according to claim 81, further comprising means for removing a parity bit from the codeword.

90. An apparatus to decode data, the data including a codeword having a plurality of blocks, the plurality of blocks comprising a first subset of blocks and a second subset of blocks, said apparatus comprising:
   a scanner to scan a plurality of segments in the codeword for a predetermined sequence;
   a first decoder to decode a scanned segment when the predetermined sequence is found in the segment;
   a second decoder to decode data in the first subset; and
   an arranger to arrange an output comprising the decoded data from the first subset and the second subset.

91. An apparatus according to claim 90, wherein said second decoder: i) determines an indicator bit of a first block of the first subset of blocks; ii) outputs all non-indicator bits in the first subset when the indicator bit is a predetermined value; and when the indicator bit is not the predetermined value; iii) determines if the first block comprises a predetermined bit pattern; iv) indexes into a memory with the predetermined bit pattern when the bit pattern in the first block matches the predetermined bit pattern; v) identifies a signature from one of the blocks of the first subset when the bit pattern in the first block does not match the predetermined bit pattern, and indexing into the memory with the signature; and vi) decodes the first sub-set of blocks according to the memory.

92. An apparatus according to claim 91, wherein the codeword is arranged as:
   $[y_1, B_1, y_2, B_2, y_3, B_3, y_4, B_4, y_5, B_8]$,
   where blocks $B_1, B_2, B_3, B_4, B_8, y_1, y_2, y_3, y_4$ and $y_5$ comprise the plurality of blocks, blocks $B_1, B_2, B_3, B_4$ and $B_8$ comprise the second subset of blocks, and blocks $y_1, y_2, y_3, y_4$ and $y_5$ comprise the first sub-set of blocks.

93. An apparatus according to claim 92, wherein the plurality of segments comprise segments $(B_1, y_2, B_2)$, $(B_3, y_4, B_4)$ and $(B_4, y_5, B_8)$.

94. An apparatus according to claim 93, wherein segments $(B_3, y_4, B_4)$ and $(B_4, y_5, B_8)$ are scanned before segment $(B_1, y_2, B_2)$.

95. An apparatus according to claim 93, wherein the predetermined sequence is identified when any one of blocks $y_2, y_4$, and $y_5$ comprises all zero bits.

96. An apparatus according to claim 90, wherein the codeword comprises data mapped according to a function of $1/(1+D^2)$, where D is a delay operator.

97. An apparatus according to claim 96, wherein the codeword comprises 65 bits and the codeword satisfies a (0, 16/19) constraint, where 16 is the maximum number of consecutive zeros after encoding, and 19 is the maximum number of consecutive zeros in an odd/even interleave.

98. An apparatus according to claim 90, further comprising a third decoder to remove a parity bit from the codeword.

99. Computer executable code stored on a computer readable medium to decode data, the data including a codeword having a plurality of blocks, the plurality of blocks comprising a first subset of blocks and a second subset of blocks, said code comprising code to:
   scan a plurality of segments in the codeword for a predetermined sequence;
   decode a scanned segment when the predetermined sequence is found in that segment;
   decode data in the first subset; and
   arrange an output to comprise the decoded data from the first subset and the second subset.

100. Computer executable code according to claim 99, wherein said code to decode data in the first subset comprises the code to:
   determine an indicator bit of a first block of the first subset of blocks;
   output all non-indicator bits in the first subset when the indicator bit is a predetermined value; and when the indicator bit is not the predetermined value,
   determine if the first block comprises a predetermined bit pattern;
   index into a memory with the predetermined bit pattern when the bit pattern in the first block matches the predetermined bit pattern;

identify a signature from one of the blocks of the first subset when the bit pattern in the first block does not match the predetermined bit pattern, and indexing into the memory with the signature; and decode the first sub-set of blocks according to the memory.

101. Computer executable code according to claim 100, wherein the codeword is arranged as:

$[y_1, B_1, y_2, B_2, y_3, B_3, y_4, B_4, y_5, B_8]$, where blocks $B_1, B_2, B_3, B_4, B_8, y_1, y_2, y_3, y_4$ and $y_5$ comprise the plurality of blocks, blocks $B_1, B_2, B_3, B_4$ and $B_8$ comprise the second subset of blocks, and blocks $y_1, y_2, y_3, y_4$ and $y_5$ comprise the first sub-set of blocks.

102. Computer executable code according to claim 101, wherein the plurality of segments comprise segments $(B_1, y_2, B_2)$, $(B_3, y_4, B_4)$ and $(B_4, y_5, B_8)$.

103. Computer executable code according to claim 102, wherein segments $(B_3, y_4, B_4)$ and $(B_4, y_5, B_8)$ are scanned before segment $(B_1, y_2, B_2)$.

104. Computer executable code according to claim 102, wherein the predetermined sequence is identified when any one of blocks $y_2, y_4, y_5$ comprises all zero bits.

105. Computer executable code according to claim 99, wherein the codeword comprises data mapped according to a function of $1/(1+D^2)$, where D is a delay operator.

106. Computer executable code according to claim 105, wherein the codeword comprises 65 bits and the codeword satisfies a (0, 16/19) constraint, where 16 is the maximum number of consecutive zeros after encoding, and 19 is the maximum number of consecutive zeros in the odd/even interleave.

107. Computer executable code according to claim 99, further comprising code to remove a parity bit from the codeword.

108. A method of encoding and decoding data comprising the steps of:

dividing the data into a plurality of blocks, with each block having a plurality of bits, wherein the plurality of blocks comprises a first subset of blocks and a second subset of blocks;

encoding data in the first subset;

arranging a codeword to comprise the encoded data of the first subset and the second subset;

scanning a plurality of segments in the codeword for at least one predetermined sequence;

encoding a scanned segment when the predetermined sequence is found in the segment;

transmitting the codeword to a memory;

retrieving the codeword from the memory;

scanning a plurality of segments in the codeword for a second predetermined sequence;

decoding a scanned segment when the second predetermined sequence is found in the segment;

decoding data of the first subset; and arranging an output to comprise the decoded data of the first subset and the second subset.

109. A method according to claim 108, wherein said encoding data step comprises the steps of:

dividing the first subset into sub-blocks;

determining the signature for each of the sub-blocks;

indexing into a second memory with a collective signature of the sub-blocks to identify encoding details for the sub-blocks, the collective signature comprising the signature of each of the sub-blocks; and determining output blocks according to the second memory.

110. A method according to claim 109, wherein the first subset is divided into five sub-blocks, with four of the sub-blocks including five bits and a fifth sub-block including four bits.

111. A method according to claim 109, wherein the collective signature of the sub-blocks comprises n signature bits, where n comprises the number of sub-blocks, and wherein each signature bit corresponds respectively to one of the sub-blocks, and wherein the bit value of each signature bit is determined according to a function s, where s is defined to be one if all bits in a respective sub-block are zero, and is defined to be zero if there is at least one non-zero bit in the respective sub-block.

112. A method according to claim 111, wherein each of the output blocks includes at least one non-zero bit.

113. A method according to claim 112, wherein the plurality of blocks respectively comprise blocks $(B_1, B_2, B_3, B_4, B_5, B_6, B_7, B_8)$, the output blocks respectively comprise blocks $(y_1, y_2, y_3, y_4, y_5)$, the first subset comprises blocks $(B_5, B_6,$ and $B_7)$, the second subset comprises blocks $(B_1, B_2, B_3, B_4, B_8)$, and the codeword comprises blocks arranged in the order of:

$[y_1, B_1, y_2, B_2, y_3, B_3, y_4, B_4, y_5, B_8]$.

114. A method according to claim 113, wherein the plurality of segments comprises segments $(B_1, y_2, B_2)$, $(B_3, y_4, B_4)$ and $(B_4, y_5, B_8)$.

115. A method according to claim 108, further comprising the step of mapping the codeword via a function of $1/(1+D^2)$, where D is a delay operator.

116. A method according to claim 115, further comprising the step of inserting a parity bit into the codeword.

117. A method according to claim 116, further comprising the step of setting the value of the parity bit so that the sum all bits in the codeword, including the inserted parity bit, is zero.

118. A method according to claim 108, wherein the codeword comprises 65 bits and the codeword satisfies a (0, 16/19) constraint, where 16 is the maximum number of consecutive zeros after encoding, and 19 is the maximum number of consecutive zeros in an odd/even interleave.

119. A method according to claim 108, wherein said step of decoding data in the first subset comprises the steps of:

determining an indicator bit of a first block of the first subset of blocks;

outputting all non-indicator bits in the first subset when the indicator bit is a predetermined value; and when the indicator bit is not the predetermined value, determining if the first block comprises a predetermined bit pattern;

indexing into a second memory with the predetermined bit pattern when the bit pattern in the first block matches the predetermined bit pattern;

identifying a signature from one of the blocks of the first subset when the bit pattern in the first block does not match the predetermined bit pattern, and indexing into the second memory with the signature; and decoding the first sub-set of blocks according to the second memory.

120. A method according to claim 119, wherein the codeword is arranged as:

$[y_1, B_1, y_2, B_2, y_3, B_3, y_4, B_4, y_5, B_8]$, where blocks $B_1, B_2, B_3, B_4, B_8, y_1, y_2, y_3, y_4$ and $y_5$ comprise the plurality of blocks, blocks $B_1, B_2, B_3, B_4$ and $B_8$ comprise the second subset of blocks, and blocks $y_1, y_2, y_3, y_4$ and $y_5$ comprise the first sub-set of blocks.

121. A method according to claim 120, wherein the plurality of segments comprise segments ($B_1$, $y_2$, $B_2$), ($B_3$, $y_4$, $B_4$) and ($B_4$, $y_5$, $B_8$).

122. A method according to claim 121, wherein segments ($B_3$, $y_4$, $B_4$) and ($B_4$, $y_5$, $B_8$) are scanned before segment ($B_1$, $y_2$, $B_2$).

123. A method according to claim 121, wherein the second predetermined sequence is identified when any one of blocks $y_2$, $y_4$, and $y_5$ comprises all zero bits.

124. A method according to claim 108, further comprising the step of removing a parity bit from the codeword.

125. An apparatus to encode and decode data comprising:
means for dividing the data into a plurality of blocks, with each block having a plurality of bits, wherein the plurality of blocks comprises a first subset of blocks and a second subset of blocks;
means for encoding data in the first subset;
means for arranging a codeword to comprise the encoded data of the first subset and the second subset;
means for scanning a plurality of segments in the codeword for at least one predetermined sequence;
means for encoding a scanned segment when the predetermined sequence is found in the segment;
means for transmitting the codeword to a memory;
means for retrieving the codeword from the memory;
means for scanning a plurality of segments in the codeword for a second predetermined sequence;
means for decoding a scanned segment when the second predetermined sequence is found in that segment;
means for decoding data of the first subset; and
means for arranging an output comprising the decoded data of the first subset and the second subset.

126. An apparatus according to claim 125, wherein said means for encoding data: i) divides the first subset into sub-blocks; ii) determines a signature for each of the sub-blocks; iii) indexes into a second memory with a collective signature of the sub-blocks to identify encoding details for the sub-blocks, the collective signature comprising the signature of each of the sub-blocks; and iv) determining output blocks according to the second memory.

127. An apparatus according to claim 126, wherein the first subset is divided into five sub-blocks, with four of the sub-blocks including five bits and a fifth sub-block including four bits.

128. An apparatus according to claim 126, wherein the collective signature of the sub-blocks comprises n signature bits, where n comprises the number of sub-blocks, and wherein each signature bit corresponds respectively to one of the sub-blocks, and wherein the bit value of each signature bit is determined according to a function s, where s is defined to be one if all bits in a respective sub-block are zero, and is defined to be zero if there is at least one non-zero bit in the respective sub-block.

129. An apparatus according to claim 128, wherein each of the output blocks includes at least one non-zero bit.

130. An apparatus according to claim 129, wherein the plurality of blocks respectively comprise blocks ($B_1$, $B_2$, $B_3$, $B_4$, $B_5$, $B_6$, $B_7$, $B_8$), the output blocks respectively comprise blocks ($y_1$, $y_2$, $y_3$, $y_4$, $y_5$), the first subset comprises blocks ($B_5$, $B_6$, and $B_7$), the second subset comprises blocks ($B_1$, $B_2$, $B_3$, $B_4$, $B_8$), and the codeword comprises blocks arranged in the order of:

[$y_1$, $B_1$, $y_2$, $B_2$, $y_3$, $B_3$, $y_4$, $B_4$, $y_5$, $B_8$].

131. An apparatus according to claim 130, wherein the plurality of segments comprises segments ($B_1$, $y_2$, $B_2$), ($B_3$, $y_4$, $B_4$) and ($B_4$, $y_5$, $B_8$).

132. An apparatus according to claim 125, further comprising means for mapping the codeword via a function of $1/(1+D^2)$, where D is a delay operator.

133. An apparatus according to claim 132, further comprising means for inserting a parity bit into the codeword.

134. An apparatus according to claim 133, further comprising means for setting the value of the parity bit so that the sum all bits in the codeword, including the inserted parity bit, is zero.

135. An apparatus according to claim 125, wherein the codeword comprises 65 bits and the codeword satisfies a (0, 16/19) constraint, where 16 is the maximum number of consecutive zeros after encoding, and 19 is the maximum number of consecutive zeros in an odd/even interleave.

136. An apparatus according to claim 125, wherein said means for decoding data in the first subset: i) determines an indicator bit of a first block of the first subset of blocks; ii) output all non-indicator bits in the first subset when the indicator bit is a predetermined value; and when the indicator bit is not the predetermined value; iii) determines if the first block comprises a predetermined bit pattern; iv) indexes into a second memory with the predetermined bit pattern when the bit pattern in the first block matches the predetermined bit pattern; v) identifies a signature from one of the blocks of the first subset when the bit pattern in the first block does not match the predetermined bit pattern, and indexing into the second memory wit the signature; and vi) decodes the first sub-set of blocks according to the second memory.

137. An apparatus according to claim 136, wherein the codeword is arranged as:

[$y_1$, $B_1$, $y_2$, $B_2$, $y_3$, $B_3$, $y_4$, $B_4$, $y_5$, $B_8$], where blocks $B_1$, $B_2$, $B_3$, $B_4$, $B_8$, $y_1$, $y_2$, $y_3$, $y_4$ and $y_5$ comprise the plurality of blocks, blocks $B_1$, $B_2$, $B_3$, $B_4$ and $B_8$ comprise the second subset of blocks, and blocks $y_1$, $y_2$, $y_3$, $y_4$ and $y_5$ comprise the first sub-set of blocks.

138. An apparatus according to claim 137, wherein the plurality of segments comprise segments ($B_1$, $y_2$, $B_2$), ($B_3$, $y_4$, $B_4$) and ($B_4$, $y_5$, $B_8$).

139. An apparatus according to claim 138, wherein segments ($B_3$, $y_4$, $B_4$) and ($B_4$, $y_5$, $B_8$) are scanned before segment ($B_1$, $y_2$, $B_2$).

140. An apparatus according to claim 138, wherein the second predetermined sequence is identified when any one of blocks $y_2$, $y_4$, and $y_5$ comprises all zero bits.

141. An apparatus according to claim 125, further comprising means for removing a parity bit from the codeword.

142. An apparatus of encoding and decoding data comprising:
a divider to divide the data into a plurality of blocks, with each block having a plurality of bits, wherein the plurality of blocks comprises a first subset of blocks and a second subset of blocks;
a first encoder to encode data in the first subset;
an arranger to arrange a codeword to comprise the encoded data of the first subset and the second subset;
a scanner to scan a plurality of segments in the codeword for at least one predetermined sequence;
a second encoder to encode a scanned segment when the predetermined sequence is found in the segment;
a transmitter to transmit the codeword to a memory;
a detector to retrieve the codeword from the memory;
a scanner to scan a plurality of segments in the encoded codeword for a second predetermined sequence;

a first decoder to decode a scanned segment when the second predetermined sequence is found in the segment;

a second decoder to decode data of the first subset; and an arranger to arrange an output comprising the decoded data of the first subset and the second subset.

143. An apparatus according to claim 142, wherein said first encoder: i) divides the first subset into sub-blocks; ii) determines a signature for each of the sub-blocks; iii) indexes into a second memory with a collective signature of the sub-blocks to identify encoding details for the sub-blocks, the collective signature comprising the signature of each of the sub-blocks; and iv) determines output blocks according to the second memory.

144. An apparatus according to claim 143, wherein the first subset is divided into five sub-blocks, with four of the sub-blocks including five bits and a fifth sub-block including four bits.

145. An apparatus according to claim 143, wherein the collective signature of the sub-blocks comprises n signature bits, where n comprises the number of sub-blocks, and wherein each signature bit corresponds respectively to one of the sub-blocks, and wherein the bit value of each signature bit is determined according to a function s, where s is defined to be one if all bits in a respective sub-block are zero, and is defined to be zero if there is at least one non-zero bit in the respective sub-block.

146. An apparatus according to claim 145, wherein each of the output blocks includes at least one non-zero bit.

147. An apparatus according to claim 146, wherein the plurality of blocks respectively comprise blocks ($B_1$, $B_2$, $B_3$, $B_4$, $B_5$, $B_6$, $B_7$, $B_8$), the output blocks respectively comprise blocks ($y_1$, $y_2$, $y_3$, $y_4$, $y_5$), the first subset comprises blocks ($B_5$, $B_6$, and $B_7$), the second subset comprises blocks ($B_1$, $B_2$, $B_3$, $B_4$, $B_8$), and the codeword comprises blocks arranged in the order of:

[$y_1$, $B_1$, $y_2$, $B_2$, $y_3$, $B_3$, $y_4$, $B_4$, $y_5$, $B_8$].

148. An apparatus according to claim 147, wherein the plurality of segments comprises segments ($B_1$, $y_2$, $B_2$), ($B_3$, $y_4$, $B_4$) and ($B_4$, $y_5$, $B_8$).

149. An apparatus according to claim 142, further comprising a precoder to map the codeword via a function of $1/(1+D^2)$, where D is a delay operator.

150. An apparatus according to claim 149, further comprising a cyclic encoder to insert a parity bit into the codeword.

151. An apparatus according to claim 150, wherein the value of the parity bit is set so that the sum all bits in the codeword, including the inserted parity bit, is zero.

152. An apparatus according to claim 142, wherein the codeword comprises 65 bits and the codeword satisfies a (0, 16/19) constraint, where 16 is the maximum number of consecutive zeros after encoding, and 19 is the maximum number of consecutive zeros in an odd/even interleave.

153. An apparatus according to claim 142, wherein said second decoder: i) determines an indicator bit of a first block of the first subset of blocks; ii) outputs all non-indicator bits in the first subset when the indicator bit is a predetermined value; and when the indicator bit is not the predetermined value; iii) determines if the first block comprises a predetermined bit pattern; iv) indexes into a second memory with the predetermined bit pattern when the bit pattern in the first block matches the predetermined bit pattern; v) identifies a signature from one of the blocks of the first subset when the bit pattern in the first block does not match the predetermined bit pattern, and indexing into the second memory with the signature; and vi) decodes the first subset of blocks according to the second memory.

154. An apparatus according to claim 153, wherein the codeword is arranged as:

[$y_1$, $B_1$, $y_2$, $B_2$, $y_3$, $B_3$, $y_4$, $B_4$, $y_5$, $B_8$], where blocks $B_1$, $B_2$, $B_3$, $B_4$, $B_8$, $y_1$, $y_2$, $y_3$, $y_4$ and $y_5$ comprise the plurality of blocks, blocks $B_1$, $B_2$, $B_3$, $B_4$ and $B_8$ comprise the second subset of blocks, and blocks $y_1$, $y_2$, $y_3$, $y_4$ and $y_5$ comprise the first sub-set of blocks.

155. An apparatus according to claim 154, wherein the plurality of segments comprise segments ($B_1$, $y_2$, $B_2$), ($B_3$, $y_4$, $B_4$) and ($B_4$, $y_5$, $B_8$).

156. An apparatus according to claim 155, wherein segments ($B_3$, $y_4$, $B_4$) and ($B_4$, $y_5$, $B_8$) are scanned before segment ($B_1$, $y_2$, $B_2$).

157. An apparatus according to claim 155, wherein the second predetermined sequence is identified when any one of blocks $y_2$, $y_4$, and $y_5$ comprises all zero bits.

158. An apparatus according to claim 157, further comprising a decoder to remove a parity bit from the codeword.

159. An apparatus according to claim 142, further comprising a decoder to remove a parity bit from the codeword.

160. Computer executable code to encode and decode data, said code comprising code to:

divide the data into a plurality of blocks, with each block having a plurality of bits, wherein the plurality of blocks comprises a first subset of blocks and a second subset of blocks;

encode data in the first subset;

arrange a codeword to comprise the encoded data of the first subset and the second subset;

scan a plurality of segments in the codeword for at least one predetermined sequence;

encode a scanned segment when the predetermined sequence is found in the segment;

transmit the codeword to a memory;

retrieve the codeword from the memory;

scan a plurality of segments in the codeword for a second predetermined sequence;

decode a scanned segment when the second predetermined sequence is found in that segment;

decode data of the first subset; and arrange an output comprising the decoded data of the first subset and the second subset.

161. Computer executable code according to claim 160, wherein said encoding data code comprises code to:

divide the first subset into sub-blocks;

determine a signature for each of the sub-blocks;

index into a second memory with a collective signature of the sub-blocks to identify encoding details for the sub-blocks, the collective signature comprising the signature of each of the sub-blocks; and determine output blocks according to the second memory.

162. Computer executable code according to claim 161, wherein the first subset is divided into five sub-blocks, with four of the sub-blocks including five bits and a fifth sub-block including four bits.

163. Computer executable code according to claim 161, wherein the collective signature of the sub-blocks comprises n signature bits, where n comprises the number of sub-blocks, and wherein each signature bit corresponds respectively to one of the sub-blocks, and wherein the bit value of each signature bit is determined according to a function s, where s is defined to be one if all bits in a respective sub-block are zero, and is defined to be zero if there is at least one non-zero bit in the respective sub-block.

164. Computer executable code according to claim 163, wherein each of the output blocks includes at least one non-zero bit.

165. Computer executable code according to claim 164, wherein the plurality of blocks respectively comprise blocks ($B_1$, $B_2$, $B_3$, $B_4$, $B_5$, $B_6$, $B_7$, $B_8$), the output blocks respectively comprise blocks ($y_1$, $y_2$, $y_3$, $y_4$, $y_5$), the first subset comprises blocks ($B_5$, $B_6$, and $B_7$), the second subset comprises blocks ($B_1$, $B_2$, $B_3$, $B_4$, $B_8$), and the codeword comprises blocks arranged in the order of:

[$y_1$, $B_1$, $y_2$, $B_2$, $y_3$, $B_3$, $y_4$, $B_4$, $y_5$, $B_8$].

166. Computer executable code according to claim 165, wherein the plurality of segments comprises segments ($B_1$, $y_2$, $B_2$), ($B_3$, $y_4$, $B_4$) and ($B_4$, $y_5$, $B_8$).

167. Computer executable code according to claim 160, further comprising code to map the codeword via a function of $1/(1+D^2)$, where D is a delay operator.

168. Computer executable code according to claim 167, further comprising code to insert a parity bit into the codeword.

169. Computer executable code according to claim 168, further comprising code to set the value of the parity bit so that the sum all bits in the codeword, including the inserted parity bit, is zero.

170. Computer executable code according to claim 160, wherein the codeword comprises 65 bits and the codeword satisfies a (0, 16/19) constraint, where 16 is the maximum number of consecutive zeros after encoding, and 19 is the maximum number of consecutive zeros in an odd/even interleave.

171. Computer executable code according to claim 160, wherein said decoding data in the first subset code comprises code to:

determine an indicator bit of a first block of the first subset of blocks;

output all non-indicator bits in the first subset when the indicator bit is a predetermined value; and when the indicator bit is not the predetermined value, determine if the first block comprises a predetermined bit pattern;

index into a second memory with the predetermined bit pattern when the bit pattern in the first block matches the predetermined bit pattern;

identify a signature from one of the blocks of the first subset when the bit pattern in the first block does not match the predetermined bit pattern, and indexing into the second memory with the signature; and decode the first sub-set of blocks according to the second memory.

172. Computer executable code according to claim 171, wherein the codeword is arranged as:

[$y_1$, $B_1$, $y_2$, $B_2$, $y_3$, $B_3$, $y_4$, $B_4$, $y_5$, $B_8$], where blocks $B_1$, $B_2$, $B_3$, $B_4$, $B_8$, $y_1$, $y_2$, $y_3$, $y_4$ and $y_5$ comprise the plurality of blocks, blocks $B_1$, $B_2$, $B_3$, $B_4$ and $B_8$ comprise the second subset of blocks, and blocks $y_1$, $y_2$, $y_3$, $y_4$ and $y_5$ comprise the first sub-set of blocks.

173. Computer executable code according to claim 172, wherein the plurality of segments comprise segments ($B_1$, $y_2$, $B_2$), ($B_3$, $y_4$, $B_4$) and ($B_4$, $y_5$, $B_8$).

174. Computer executable code according to claim 173, wherein segments ($B_3$, $y_4$, $B_4$) and ($B_4$, $y_5$, $B_8$) are scanned before segment ($B_1$, $y_2$, $B_2$).

175. Computer executable code according to claim 173, wherein the second predetermined sequence is identified when any one of blocks $y_2$, $y_4$, and $y_5$ comprises all zero bits.

176. Computer executable code according to claim 160, further comprising code to remove a parity bit from the codeword.

177. A method of encoding data with a run length limited code, said method comprising the steps of:

dividing the data into equal blocks, the equal blocks comprising a first subset of equal blocks and a second subset of equal blocks;

encoding data within the first subset of the equal blocks, wherein the encoded data comprises more bits than the data of the first subset;

dividing the encoded data into output blocks;

recombining the output blocks and the second subset of equal blocks;

selecting segments of the recombined blocks;

scanning the segments for at least one predetermined bit pattern;

adjusting at least one segment when a predetermined bit pattern is identified in the segment; and outputting the recombined blocks when the at least one predetermined bit pattern is not identified.

178. A method of designing an encoding/decoding table for encoding input data blocks and decoding encoded data comprising the steps of:

arranging the table in rows and columns, each of the rows containing information corresponding to a specific input data signature, a first column corresponding to input data signatures, and a plurality of the columns respectively corresponding table output blocks;

assigning, with respect to rows, the input data blocks which contain at least one non-zero bit value to an output block according to respective signatures; and requiring each table entry to contain at least one non-zero bit.

179. A method according to claim 178, further comprising the step of appending an additional bit to the input blocks in one of the plurality of columns.

180. A method according to claim 179, wherein the additional bit is an indicator bit.

181. A method according to claim 180, wherein the additional bit is zero for a respective input data signature having all zero bits.

182. A method according to claim 181, wherein the additional bit is one for a respective input data signature having at least one non-zero bit.

183. A method according to claim 182, further comprising the step of assigning input data signatures to output blocks.

184. A method according to claim 183, wherein a signature is assigned to an output block when the additional bit is one and when the signature does not correspond to a predetermined bit pattern.

185. A method according to claim 184, further comprising the step of substituting placeholders in the table for input data blocks having all zero bits.

186. A computer readable medium having a 24/25 encoding/decoding table stored thereon, the table comprising rows, columns and table entries as follows:

| $S_1S_2S_3S_4S_5$ | $y_1$ | $y_2$ | 3 | $y_4$ | $y_5$ |
|---|---|---|---|---|---|
| 00000 | $x_1$ | $x_2$ | $x_3$ | $x_4$ | $x_5$,0 |
| 10000 | S | $x_2$ | $x_3$ | $x_4$ | $x_5$,1 |
| 01000 | S | $x_1$ | $x_3$ | $x_4$ | $x_5$,1 |

-continued

| $S_1S_2S_3S_4S_5$ | $y_1$ | $y_2$ | $y_3$ | $y_4$ | $y_5$ |
|---|---|---|---|---|---|
| 11000 | S | Free | $x_3$ | $x_4$ | $x_5$,1 |
| 00100 | S | $x_1$ | $x_2$ | $x_4$ | $x_6$,1 |
| 10100 | S | $x_2$ | Free | $x_4$ | $x_5$,1 |
| 01100 | S | $x_1$ | Free | $x_4$ | $x_5$,1 |
| 11100 | S | Free | Free | $x_4$ | $x_5$,1 |
| 00010 | S | $x_1$ | $x_2$ | $x_3$ | $x_5$,1 |
| 10010 | S | $x_2$ | $x_3$ | Free | $x_5$,1 |
| 01010 | S | $x_1$ | $x_3$ | Free | $x_5$,1 |
| 11010 | S | Free | $x_3$ | Free | $x_5$,1 |
| 00110 | S | $x_1$ | $x_2$ | Free | $x_5$,1 |
| 10110 | S | $x_2$ | Free | Free | $x_5$,1 |
| 01110 | S | $x_1$ | Free | Free | $x_5$,1 |
| 11110 | S | Free | Free | Free | $x_5$,1 |
| 00001 | $x_1$ | $x_2$ | $x_3$ | $x_4$ | 0000,1 |
| 10001 | S | $x_2$ | $x_3$ | $x_4$ | 1110,1 |
| 01001 | S | $x_1$ | $x_3$ | $x_4$ | 1110,1 |
| 11001 | S | Free | $x_3$ | $x_4$ | 1110,1 |
| 00101 | S | $x_1$ | $x_2$ | $x_4$ | 1110,1 |
| 10101 | S | $x_2$ | Free | $x_4$ | 1110,1 |
| 01101 | S | $x_1$ | Free | $x_4$ | 1110,1 |
| 11101 | S | Free | Free | $x_4$ | 1110,1 |
| 00011 | S | $x_1$ | $x_2$ | $x_3$ | 1110,1 |
| 10011 | S | $x_2$ | $x_3$ | Free | 1110,1 |
| 01011 | S | $x_1$ | $x_3$ | Free | 1110,1 |
| 11011 | S | Free | $x_3$ | Free | 1110,1 |
| 00111 | S | $x_1$ | $x_2$ | Free | 1110,1 |
| 10111 | S | $x_2$ | Free | Free | 1110,1 |
| 01111 | S | $x_1$ | Free | Free | 1110,1 |
| 11111 | S | Free | Free | Free | 1110,1 | where $S_1$, $S_2$, $S_3$, $S_4$, $S_5$ respectively comprise a signature of input data blocks $x_1$, $x_2$, $x_3$, $x_4$, and $x_5$, S comprises ($S_1$ $S_2$ $S_3$ $S_4$ $S_5$), where $y_1$, $y_2$, $y_3$, $y_4$, $y_5$ comprise respective output data blocks, and Free comprises placeholder data.

187. A computer readable medium according to claim 186, wherein the placeholder data comprises 11101.

188. A computer readable medium according to claim 187, wherein a signature Si is one (1) if all bits in an input data block are zero and is zero if at least one bit in the input data block is non-zero (0), wherein i comprises any one of 1 through 5.

189. An electronic memory circuit having a 24/25 encoding/decoding table stored therein, the table comprising rows, columns and table entries as follows:

| $S_1S_2S_3S_4S_5$ | $y_1$ | $y_2$ | $y_3$ | $y_4$ | $y_5$ |
|---|---|---|---|---|---|
| 00000 | $x_1$ | $x_2$ | $x_3$ | $x_4$ | $x_5$,0 |
| 10000 | S | $x_2$ | $x_3$ | $x_4$ | $x_5$,1 |
| 01000 | S | $x_1$ | $x_3$ | $x_4$ | $x_5$,1 |
| 11000 | S | Free | $x_3$ | $x_4$ | $x_5$,1 |
| 00100 | S | $x_1$ | $x_2$ | $x_4$ | $x_5$,1 |
| 10100 | S | $x_2$ | Free | $x_4$ | $x_5$,1 |
| 01100 | S | $x_1$ | Free | $x_4$ | $x_5$,1 |
| 11100 | S | Free | Free | $x_4$ | $x_5$,1 |
| 00010 | S | $x_1$ | $x_2$ | $x_3$ | $x_5$,1 |
| 10010 | S | $x_2$ | $x_3$ | Free | $x_5$,1 |
| 01010 | S | $x_1$ | $x_3$ | Free | $x_5$,1 |
| 11010 | S | Free | $x_3$ | Free | $x_5$,1 |
| 00110 | S | $x_1$ | $x_2$ | Free | $x_5$,1 |
| 10110 | S | $x_2$ | Free | Free | $x_5$,1 |
| 01110 | S | $x_1$ | Free | Free | $x_5$,1 |
| 11110 | S | Free | Free | Free | $x_5$,1 |
| 00001 | $x_1$ | $x_2$ | $x_3$ | $x_4$ | 0000,1 |
| 10001 | S | $x_2$ | $x_3$ | $x_4$ | 1110,1 |
| 01001 | S | $x_1$ | $x_3$ | $x_4$ | 1110,1 |
| 11001 | S | Free | $x_3$ | $x_4$ | 1110,1 |
| 00101 | S | $x_1$ | $x_2$ | $x_4$ | 1110,1 |
| 10101 | S | $x_2$ | Free | $x_4$ | 1110,1 |
| 01101 | S | $x_1$ | Free | $x_4$ | 1110,1 |
| 11101 | S | Free | Free | $x_4$ | 1110,1 |
| 00011 | S | $x_1$ | $x_2$ | $x_3$ | 1110,1 |
| 10011 | S | $x_2$ | $x_3$ | Free | 1110,1 |
| 01011 | S | $x_1$ | $x_3$ | Free | 1110,1 |
| 11011 | S | Free | $x_3$ | Free | 1110,1 |
| 00111 | S | $x_1$ | $x_2$ | Free | 1110,1 |
| 10111 | S | $x_2$ | Free | Free | 1110,1 |
| 01111 | S | $x_1$ | Free | Free | 1110,1 |
| 11111 | S | Free | Free | Free | 1110,1 | where $S_1$, $S_2$, $S_3$, $S_4$, $S_5$ respectively comprise a signature of input data blocks $x_1$, $x_2$, $x_3$, $x_4$, and $x_5$, S comprises ($S_1$ $S_2$ $S_3$ $S_4$ $S_5$), $y_1$, $y_2$, $y_3$, $y_4$, $y_5$ comprise respective output data blocks, and free comprises placeholder data.

190. An electronic memory circuit according to claim 189, wherein the placeholder data comprises 11101.

191. An electronic memory circuit according to claim 190, wherein a signature Si is one (1) if all bits in an input data block are zero and is zero if at least one bit in the input data block is non-zero (0), wherein i comprises any one of 1 through 5.

192. A method of decoding a 25-bit codeword comprising the steps of:

sub-dividing the codeword into five equal blocks, each of the equal blocks including five bits, identifying a value of an indicator bit of the codeword;

outputting the first 24 bits of the codeword when the indicator bit is a predetermined value; and when the indicator bit is not the predetermined value, determining whether the bits in a first block of the equal blocks match a predetermined bit pattern;

recovering a signature from a second block of the equal blocks and indexing into a memory with the signature when the bits in the first block do not match the predetermined pattern;

indexing into the memory with the predetermined bit pattern when the bits in the first selected block do not match the predetermined pattern; and decoding the codeword according to the memory.

193. A method of decoding a codeword, the codeword comprising a first subset of blocks and a second subset of blocks, each block comprising a plurality of bits, said method comprising the steps of:

scanning a plurality of segments of the codeword, a segment comprising at least one block of the codeword;

decoding a segment when an indicator in the segment contains a predetermined bit pattern;

decoding the first subset of blocks; and constructing a string comprising the second subset and the decoded data of the first subset.

194. A method according to claim 193, wherein the codeword is arranged as:

[$y_1$, $B_1$, $y_2$, $B_2$, $y_3$, $B_3$, $y_4$, $B_4$, $y_5$, $B_8$], where blocks $B_1$, $B_2$, $B_3$, $B_4$ and $B_8$ comprise the second subset of blocks, and blocks $y_1$, $y_2$, $y_3$, $y_4$ and $y_5$ comprise the first subset of blocks.

195. A method according to claim 194, wherein the plurality of segments comprise segments ($B_1$, $y_2$, $B_2$), ($B_3$, $y_4$, $B_4$) and ($B_4$, $y_5$, $B_8$).

196. A method according to claim 195, wherein segments ($B_3$, $y_4$, $B_4$) and ($B_4$, $y_5$, $B_8$) are scanned before segment ($B_1$, $y_2$, $B_2$).

197. A method according to claim 195, wherein the indicator comprises any one of blocks $y_2$, $y_4$ and $y_5$, and the predetermined pattern is a bit pattern comprising all zero bits.

198. A method according to claim 197, wherein said decoding step comprises the step of determining the value of a first indicator bit in the segment when the bit pattern comprises all zero bits.

199. A method according to claim 198, wherein when the first indicator bit comprises a zero value in the ($B_1$, $y_2$, $B_2$) segment, said decoding step comprises the steps of:
  moving the third $B_2$ bit to the second $B_2$ bit, where the first bit is the least significant bit in each block, and after moving the third $B_2$ bit, setting the third $B_2$ bit to zero (0);
  switching the eighth $B_1$ bit with the fifth $y_2$ bit, where the first bit is the least significant bit in each block;
  switching the sixth $B_1$ bit with the third $y_2$ bit, where the first bit is the least significant bit in each block; and
  switching the fourth $B_1$ bit with the first $y_2$ bit, where the first bit is the least significant bit in each block.

200. A method according to claim 199, wherein the first indicator bit is the first $B_2$ bit.

201. A method according to claim 198, wherein when the first indicator bit comprises a non-zero value in the ($B_1$, $y_2$, $B_2$) segment, said decoding step comprises the steps of:
  moving the second $B_2$ bit to the first $B_2$ bit, where the first bit is the least significant bit in each block, and after moving the second $B_2$ bit, setting the second $B_1$ bit to zero;
  switching the seventh $B_1$ bit with the fourth $y_2$ bit, where the first bit is the least significant bit in each block; and
  switching the fifth $B_1$ bit with the second $y_2$ bit, where the first bit is the least significant bit in each block.

202. A method according to claim 201, wherein the first indicator bit is the first $B_2$ bit.

203. A method according to claim 197, wherein said decoding step comprises the step of determining the value of a second indicator bit in the segment.

204. A method according to claim 202, wherein when the second indicator bit comprises a zero value in the ($B_3$, $y_4$, $B_4$) segment, said decoding step comprises the steps of:
  moving the first $B_3$ bit to the eighth $B_3$ bit, where the first bit is the least significant bit in each block, and after moving the first $B_3$ bit, setting the first $B_3$ bit to zero (0);
  switching the fifth $B_3$ bit with the fourth $y_4$ bit, where the first bit is the least significant bit in each block;
  switching the third $B_3$ bit with the second $y_4$ bit, where the first bit is the least significant bit in each block; and
  setting the second $B_4$ bit to zero (0), where the first bit is the least significant bit in each block.

205. A method according to claim 204, wherein the first indicator bit is the seventh $B_3$ bit.

206. A method according to claim 205, wherein when the second indicator bit comprises a non-zero value in the ($B_3$, $y_4$, $B_4$) segment, said decoding step comprises the steps of:
  moving the eighth $B_3$ bit to the seventh $B_3$ bit, where the first bit is the least significant bit in each block, and after moving the eighth $B_3$ bit, setting the eighth $B_3$ bit to zero (0);
  switching the sixth $B_3$ bit with the fifth $y_4$ bit, where the first bit is the least significant bit in each block;
  switching the fourth $B_3$ bit with the third $y_4$ bit, where the first bit is the least significant bit in each block;
  switching the second $B_3$ bit with the first $y_4$ bit, where the first bit is the least significant bit in each block; and
  setting the first $B_4$ bit to zero (0).

207. A method according to claim 206, wherein the second indicator bit is the seventh $B_3$ bit.

208. A method according to claim 203, wherein when the first indicator bit comprises a non-zero value in the ($B_4$, $y_5$, $B_8$) segment, said decoding step comprises the steps of:
  moving the eighth $B_4$ bit to the seventh $B_4$ bit, where the first bit is the least significant bit in each block, and after moving the seventh $B_4$ bit setting the eighth $B_4$ bit to zero (0);
  switching the sixth $B_4$ bit with the fifth $y_5$ bit, where the first bit is the least significant bit in each block;
  switching the fourth $B_4$ bit with the third $y_5$ bit, where the first bit is the least significant bit in each block;
  switching the second $B_4$ bit with the first $y_5$ bit, where the first bit is the least significant bit in each block; and
  setting the first $B_8$ bit to zero.

209. A method according to claim 208, wherein the first indicator bit is the seventh $B_4$ bit.

210. A method according to claim 203, wherein when the second indicator bit comprises a zero value in the ($B_4$, $y_5$, $B_8$) segment, said decoding step comprises the steps of:
  moving the first $B_4$ bit to the eighth $B_4$ bit, where the first bit is the least significant bit in each block, and after moving the first $B_4$ bit setting the first $B_4$ bit to zero (0);
  switching the fifth $B_4$ bit with the fourth $y_5$ bit, where the first bit is the least significant bit in each block;
  switching the third $B_4$ bit with the second $y_5$ bit, where the first bit is the least significant bit in each block; and
  setting the second $B_8$ bit to zero (0), where the first bit is the least significant bit in the block.

211. A method according to claim 210, wherein the first indicator bit is the seventh $B_4$ bit.

212. A method according to claim 193, wherein said step of decoding the first subset of blocks comprises the steps of:
  determining an indicator bit of a first block of the first subset;
  outputting all non-indicator bits in the first subset when the indicator bit is a predetermined value; and when the indicator bit is not the predetermined value,
  determining if the first block comprises a predetermined bit pattern;
  indexing into a memory with the predetermined bit pattern when the bit pattern in the first block matches the predetermined bit pattern;
  identifying a signature from a block of the first subset when the bit pattern in the first block does not match the predetermined bit pattern, and indexing into the memory with the signature; and
  decoding the first subset of blocks according to the memory.

213. A method according to claim 193, wherein the codeword comprises data mapped according to a function of $1/(1+D^2)$, where D is a delay operator.

214. A method of generating a modulation code from a n-bit codeword, where n is a number of bits, said method comprising the steps of:
  inserting a parity bit into the n-bit codeword to generate a run length limited code comprising n+1 bits; and
  setting the value of the parity bit so that the sum all n+1 bits in the codeword, including the inserted parity bit, is zero.

215. A method according to claim 214, wherein n comprises 65, and the modulation code comprises a 64/66 code.

216. A method according to claim 215, wherein the modulation code satisfies a (0, 17/19) constraint, where 17 is the maximum number of consecutive zeros after encoding, and 19 is the maximum number of consecutive zeros in an odd/even interleave.

217. A method according to claim 216, wherein the sum is defined by modulo $2 \equiv \oplus$, so that $1+1=0$, $1+0=1$, $0+1=1$, and $0+0=0$.

218. A method according to claim 216, wherein said setting step comprises the steps of:

initializing the parity bit to zero (0);

setting the parity bit to: $b_1 \char`\^ b_2 \char`\^ b_5 \char`\^ b_6 \char`\^ b_9 \char`\^ b_{10} \char`\^ b_{13} \char`\^ b_{14} \char`\^ \ldots \char`\^ b_{53} \char`\^ b_{54} \char`\^ b_{57} \char`\^ b_{58} \char`\^ b_{61} \char`\^ b_{62} \char`\^ b_{65} \char`\^ b_{66} \char`\^ D$, where $b_i$ is the $i$th bit of a codeword, starting from 1 and counting left to right, the symbol "^" is the XOR operation, and D is a parity insertion variable; and then resetting the parity insertion variable D to: $D = D \char`\^ b_1 \char`\^ b_2 \char`\^ b_3 \char`\^ b_4 \char`\^ b_5 \char`\^ b_6 \char`\^ \ldots \char`\^ b_{62} \char`\^ b_{63} \char`\^ b_{64} \char`\^ b_{65} \char`\^ b_{66}$.

219. An apparatus to generate a modulation code from an n-bit codeword, where n is a number of bits, comprising:

means for inserting a parity bit into the n-bit codeword to generate a run length limited code comprising n+1 bits; and means for setting the value of the parity bit so that the sum all n+1 bits in the codeword, including the inserted parity bit, is zero.

220. An apparatus according to claim 219, wherein n comprises 65, and the modulation code comprises a 64/66 code.

221. An apparatus according to claim 220, wherein the modulation code satisfies a (0, 17/19) constraint, where 17 is the maximum number of consecutive zeros after encoding, and 19 is the maximum number of consecutive zeros in an odd/even interleave.

222. An apparatus according to claim 221, wherein the sum is defined by modulo $2 \equiv \oplus$, so that $1+1=0$, $1+0=1$, $0+1=1$, and $0+0=0$.

223. An apparatus according to claim 221, wherein said setting means: i) initializes the parity bit to zero (0); ii) sets the parity bit to: $b_1 \char`\^ b_2 \char`\^ b_5 \char`\^ b_6 \char`\^ b_9 \char`\^ b_{10} \char`\^ b_{13} \char`\^ b_{14} \char`\^ \ldots \char`\^ b_{53} \char`\^ b_{54} \char`\^ b_{57} \char`\^ b_{58} \char`\^ b_{61} \char`\^ b_{62} \char`\^ b_{65} \char`\^ b_{66} \char`\^ D$, where $b_i$ is the $i$th bit of a codeword, starting from 1 and counting left to right, the symbol "^" is the XOR operation, and D is a parity insertion variable; and then iii) resets the parity insertion variable D to: $D = D \char`\^ b_1 \char`\^ b_2 \char`\^ b_3 \char`\^ b_4 \char`\^ b_5 \char`\^ b_6 \char`\^ \ldots \char`\^ b_{62} \char`\^ b_{63} \char`\^ b_{64} \char`\^ b_{65} \char`\^ b_{66}$.

224. An apparatus to generate a modulation code from an n-bit codeword, where n is a number of bits, comprising:

a cyclic encoder which: i) inserts a parity bit into the n-bit codeword to generate a run length limited code comprising n+1 bits; and ii) sets the value of the parity bit so that the sum all n+1 bits in the codeword, including the inserted parity bit, is zero.

225. An apparatus according to claim 224, wherein n comprises 65, and the modulation code comprises a 64/66 code.

226. An apparatus according to claim 225, wherein the modulation code satisfies a (0, 17/19) constraint, where 17 is the maximum number of consecutive zeros after encoding, and 19 is the maximum number of consecutive zeros in an odd/even interleave.

227. An apparatus according to claim 226, wherein the sum is defined by modulo $2 \equiv \oplus$, so that $1+1=0$, $1+0=1$, $0+1=1$, and $0+0=0$.

228. An apparatus according to claim 226, wherein when said setting the value of the parity bit, said cyclic encoder: i) initializes the parity bit to zero (0); ii) sets the parity bit to: $b_1 \char`\^ b_2 \char`\^ b_5 \char`\^ b_6 \char`\^ b_9 \char`\^ b_{10} \char`\^ b_{13} \char`\^ b_{14} \char`\^ \ldots \char`\^ b_{53} \char`\^ b_{54} \char`\^ b_{57} \char`\^ b_{58} \char`\^ b_{61} \char`\^ b_{62} \char`\^ b_{65} \char`\^ b_{66} \char`\^ D$, where $b_i$ is the $i$th bit of a codeword, starting from 1 and counting left to right, the symbol "^" is the XOR operation, and D is a parity insertion variable; and then iii) resets the parity insertion variable D to: $D = D \char`\^ b_1 \char`\^ b_2 \char`\^ b_3 \char`\^ b_4 \char`\^ b_5 \char`\^ b_6 \char`\^ \ldots \char`\^ b_{62} \char`\^ b_{63} \char`\^ b_{64} \char`\^ b_{65} \char`\^ b_{66}$.

229. Computer executable code to generate a modulation code from a n-bit codeword, where n is a number of bits, said code comprising code to:

insert a parity bit into the n-bit codeword to generate a run length limited code comprising n+1 bits; and set the value of the parity bit so that the sum all n+1 bits in the codeword, including the inserted parity bit, is zero.

230. Computer executable code according to claim 229, wherein n comprises 65, and the modulation code comprises a 64/66 code.

231. Computer executable code according to claim 230, wherein the modulation code satisfies a (0, 17/19) constraint, where 17 is the maximum number of consecutive zeros after encoding, and 19 is the maximum number of consecutive zeros in an odd/even interleave.

232. Computer executable code according to claim 231, wherein the sum is defined by modulo $2 \equiv \oplus$, so that $1+1=0$, $1+0=1$, $0+1=1$, and $0+0=0$.

233. Computer executable code according to claim 231, further comprising the code to:

initialize the parity bit to zero (0);

set the parity bit to: $b_1 \char`\^ b_2 \char`\^ b_5 \char`\^ b_6 \char`\^ b_9 \char`\^ b_{10} \char`\^ b_{13} \char`\^ b_{14} \char`\^ \ldots \char`\^ b_{53} \char`\^ b_{54} \char`\^ b_{57} \char`\^ b_{58} \char`\^ b_{61} \char`\^ b_{62} \char`\^ b_{65} \char`\^ b_{66} \char`\^ D$, where $b_i$ is the $i$th bit of a codeword, starting from 1 and counting left to right, the symbol "^" is the XOR operation, and D is a parity insertion variable; and then reset the parity insertion variable D to: $D = D \char`\^ b_1 \char`\^ b_2 \char`\^ b_3 \char`\^ b_4 \char`\^ b_5 \char`\^ b_6 \char`\^ \ldots \char`\^ b_{62} \char`\^ b_{63} \char`\^ b_{64} \char`\^ b_{65} \char`\^ b_{66}$.

\* \* \* \* \*